(12) United States Patent
Beilstein, Jr. et al.

(10) Patent No.: US 6,174,763 B1
(45) Date of Patent: Jan. 16, 2001

(54) THREE-DIMENSIONAL SRAM TRENCH STRUCTURE AND FABRICATION METHOD THEREFOR

(75) Inventors: Kenneth Edward Beilstein, Jr., Essex Junction; Claude Louis Bertin, S. Burlington; John Edward Cronin, Milton; Francis Roger White, Essex Junction, all of VT (US)

(73) Assignee: International Business Machines Corporation, Armonk, NY (US)

( * ) Notice: Under 35 U.S.C. 154(b), the term of this patent shall be extended for 0 days.

(21) Appl. No.: 08/778,609

(22) Filed: Jan. 6, 1997

Related U.S. Application Data

(62) Division of application No. 08/386,721, filed on Feb. 8, 1995, now Pat. No. 5,670,803.

(51) Int. Cl.[7] ............................................... H01L 21/8244

(52) U.S. Cl. ........................................ 438/238; 438/268

(58) Field of Search .................................... 438/238, 239, 438/253–256, 381, 396–399, 268

(56) References Cited

U.S. PATENT DOCUMENTS

| | | | |
|---|---|---|---|
| 4,293,053 | 10/1981 | Malhi et al. | 257/330 |
| 4,364,074 | 12/1982 | Garnacahe et al. | 257/333 |
| 4,653,025 | 3/1987 | Minato et al. | 365/154 |
| 4,740,826 | 4/1988 | Chatterjeee | 357/42 |
| 4,794,561 | 12/1988 | Hsu | 365/182 |
| 4,821,235 | 4/1989 | Heald | 365/177 |
| 4,890,144 | 12/1989 | Teng et al. | 357/23.4 |
| 4,920,397 | 4/1990 | Ishijima | 257/903 |
| 4,929,988 | 5/1990 | Yoshikawa | 257/331 |
| 4,987,090 | 1/1991 | Hsu et al. | 437/52 |
| 4,997,783 | 3/1991 | Hsu | 437/52 |
| 5,001,539 | 3/1991 | Inoue et al. | 357/41 |
| 5,016,070 | 5/1991 | Sundaresan | 357/23.6 |
| 5,055,898 | 10/1991 | Beilstein, Jr. et al. | 357/23.6 |
| 5,089,862 | 2/1992 | Warner, Jr. et al. | 257/74 |

(List continued on next page.)

FOREIGN PATENT DOCUMENTS

| | | |
|---|---|---|
| 60-239052 | of 1985 | (JP) . |
| 63-221665 | of 1988 | (JP) . |
| 63-237561 | of 1988 | (JP) . |
| 1-265558 | of 1989 | (JP) . |
| 64-61050 | of 1989 | (JP) . |

OTHER PUBLICATIONS

IBM Technical Disclosure Bulletin, vol. 33, No. 1B, Beilstein, Jr. et al. "Three–Dimensional, Six–Device, CMOS SRAM Cell Structure," Jun. 1990.

IBM Technical Disclosure Bulletin, vol. 33, No. 9, Hwang & Rajeevakumar, "Dense SRAM Cell Structure For 16Mb SRAM Chip and Beyond," Feb. 1991.

IBM Technical Disclosure Bulletin, vol. 34, No. 2, Gambino et al., "High Density SRAM Structure With A New Three–Dimensional, High–Performance, High–Packing Density, Planar Inverter Design," Jul. 1991.

IBM Technical Disclosure Bulletin, vol. 34, No. 6, Chang, "High–Density CMOS SRAM Cell," Nov. 1991.

*Primary Examiner*—Joni Chang
(74) *Attorney, Agent, or Firm*—Heslin & Rothenberg, P.C.

(57) ABSTRACT

A three-dimensional five transistor SRAM trench structure and fabrication method therefor are set forth. The SRAM trench structure includes four field-effect transistors ("FETs") buried within a single trench. Specifically, two FETs are located at each of two sidewalls of the trench with one FET being disposed above the other FET at each sidewall. Coaxial wiring electrically cross-couples the FETs within the trench such that a pair of cross-coupled inverters comprising the storage flip-flop for the SRAM cell is formed, A fifth, I/O transistor is disposed at the top of the trench structure, and facilitates access to the flip-flop. Specific details of the SRAM trench structure, and fabrication methods therefor are also set forth.

11 Claims, 28 Drawing Sheets

U.S. PATENT DOCUMENTS

| | | | |
|---|---|---|---|
| 5,096,849 | 3/1992 | Beilstein, Jr. et al. | 437/67 |
| 5,122,846 | 6/1992 | Haken | 357/23.4 |
| 5,122,848 | 6/1992 | Lee et al. | 257/331 |
| 5,285,093 | 2/1994 | Lage et al. | 257/332 |
| 5,308,782 * | 5/1994 | Mazure et al. | 437/52 |
| 5,324,973 * | 6/1994 | Sivan | 257/330 |
| 5,376,814 | 12/1994 | Lee | 257/903 |
| 5,442,214 | 8/1995 | Yang | 257/333 |

* cited by examiner

THREE-DIMENSIONAL SRAM TRENCH STRUCTURE AND FABRICATION METHOD THEREFOR

This application is a division of application Ser. No. 08/386,721 filed Feb. 8, 1995 which application is now Pat. No. 5,670,803.

TECHNICAL FIELD

The present invention relates in general to integrated semiconductor circuits formed as part of trench structures, and more particularly, to vertical transistors and memory cells disposed completely within a semiconductor trench structure and to associated fabrication methods therefor.

BACKGROUND OF THE INVENTION

As the integrated circuit industry continues to explore techniques used to pack more circuits into a given semiconductor substrate, more and more thought is devoted to not only orienting the various devices in planar fashion along the surface of the substrate, but also to orienting the devices vertically. Typically, this is performed by either building up from the substrate surface or by burying devices in trenches formed within the face of the semiconductor body.

Parallel with an exponential growth in the use of integrated circuit ("IC") chips has been the development of numerous types of semiconductor memory devices. Advancements in semiconductor technology have made possible memory chips with millions of locations for storing bits of data information. While each generation of memory chips continues to quadruple the number of available storage locations, the size of the integrated circuit chip must yet be maintained within certain limits to enhance production yields and accommodate conventional packaging schemes.

One common memory cell employed in large integrated circuit memory chips comprises a static random access memory ("SRAM") cell wherein a bit is represented by the state of a circuit comprising a pair of cross-coupled inverters. A majority of SRAMs are fabricated using field effect transistor ("FET") technology. With appropriate voltage adjustment, these circuits can be reduced in area simply by scaling to a smaller dimension. Specifically, all dimensions of the various process masks can be uniformly shrunk so that the resulting circuitry is fabricated in a smaller area on the wafer. One obvious limitation of scaling an integrated circuit is the photolithographic technique used to form and maintain registration of the various masks. Thus, other methods for reducing the size of individual SRAM "cells" so as to increase the memory density on an IC chip are necessary.

Many different types of semiconductor trench constructions have been proposed in the art, all aimed at reducing the cell size of SRAMs and other circuit components without compromising the performance of the circuit. One approach taken in the art to conserve semiconductor wafer area is to form the transistors comprising the SRAM cell in a vertical orientation in a trench rather than in a lateral orientation across the surface of the substrate. However, as of this date, no complete SRAM cell has been formed in association with a single trench. Thus, a need exists for additional trench structures, particularly new multiple device trench structures which facilitate the fabrication of extremely high density IC chips

DISCLOSURE OF THE INVENTION

Briefly described, in a first aspect, the present invention comprises a semiconductor trench structure. The semiconductor trench structure includes a substrate, a first semiconductor device disposed on the substrate and a second semiconductor device disposed substantially adjacent to the first semiconductor device. Further, a trench intersects the first semiconductor device and the second semiconductor device. Disposed within the trench is means for electrical connection which is electrically connected to the first semiconductor device and the second semiconductor device such that they are electrically cross-coupled within the trench. A semiconductor device may comprise, for example, a field-effect transistor ("FET").

As an enhancement, the semiconductor trench structure may also include a third semiconductor device and a fourth semiconductor device, each being intersected by the trench. The means for electrical connection may comprise coaxial wiring which may electrically cross-couple the third and fourth semiconductor devices as well as the first and second semiconductor devices.

Further enhancements may comprise locating the first and second semiconductor devices at a first sidewall of the trench, while the third and fourth semiconductor devices may be located at a second sidewall of the trench. Moreover, the second semiconductor device may be located above the first semiconductor device and the fourth semiconductor device may be located above the third semiconductor device.

In another aspect, the present invention comprises a method for forming a semiconductor trench structure. The method includes the steps of providing a substrate, forming a first semiconductor device on the substrate and forming a second semiconductor device substantially adjacent to the first semiconductor device. A trench is then formed intersecting the first and second semiconductor devices. Furthermore, the method includes electrically cross-coupling the first and second semiconductor devices within the trench.

As an enhancement, the method may include forming a third semiconductor device coplanar with the first semiconductor device and forming a fourth semiconductor device coplanar with the second semiconductor device. The electrical cross-coupling may then be performed such that the third and fourth semiconductor devices are also electrically crosscoupled within the trench.

As further enhancements, the steps of forming the first and third semiconductor devices may comprise forming a first silicon-on-insulator ("SOI") layer on the substrate, and forming the first and third semiconductor devices within a silicon layer thereof. Similarly, the steps of forming the second and fourth semiconductor device may comprise forming a second SOI layer on the first SOI layer, and forming the second and fourth semiconductor devices within a silicon layer of the second SOI layer.

In yet another embodiment, the present invention includes an SRAM cell comprising a semiconductor structure having a trench disposed therein, wherein the trench extends along an axis substantially orthogonal to a top surface of the semiconductor structure. The SRAM cell also includes a first inverter formed in the semiconductor structure at a first axial location along the trench, and a second inverter formed in the semiconductor structure at a second axial location along the trench. Further, means for electrical cross-coupling is disposed within the trench, with the first and second inverters being electrically cross-coupled thereby. Thus, the electrically cross-coupled first and second inverters comprise a flip-flop.

The SRAM cell also includes an I/O transistor formed in the semiconductor structure. The I/O transistor is electrically connected to the means for electrical cross-coupling for facilitating writing to and reading from the SRAM cell. As enhancements, the means for electrical cross-coupling may comprise coaxial wiring. Furthermore, each of the two inverters may comprise a pair of FETs.

The five transistor SRAM cell of the present invention has particular advantages and features associated therewith. For instance, by forming the complete storage flip-flop of an SRAM cell in association with a single active trench structure, significant substrate space is saved. Thus, overall memory density is increased.

Moreover, the process for forming the SRAM of the present invention facilitates very well controlled vertical channel lengths. Such control is achieved by building the doped regions and channels in the substrate prior to etching the trenches. Thus, the widths of the channels and doped regions of the FET devices of the memory cell are controlled by implantation.

Further features of the present invention include the use of coaxial wiring within the active trench to electrically cross-couple the FETs of the memory cell and the inverters composed thereof. Thus, electrical cross-coupling of devices outside of the active trench is unnecessary, further reducing the substrate area necessary for the SRAM device described herein.

Therefore, a vertically oriented, high-density, five transistor (e.g. FET) SRAM memory cell is described, along with a fabrication method therefor. Such a memory cell further contributes in density and device integration/interconnection to the semiconductor memory technology field.

BRIEF DESCRIPTION OF THE DRAWINGS

The subject matter which is regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

BEST MODE FOR CARRYING OUT THE INVENTION

Fabrication methods for forming SRAM cells in accordance with the present invention are described below in detail with reference to FIGS. 1–24. Each individual processing step described herein may be performed by standard chip or wafer level processing as will be apparent to those skilled in the semiconductor fabrication art.

Figure 1:
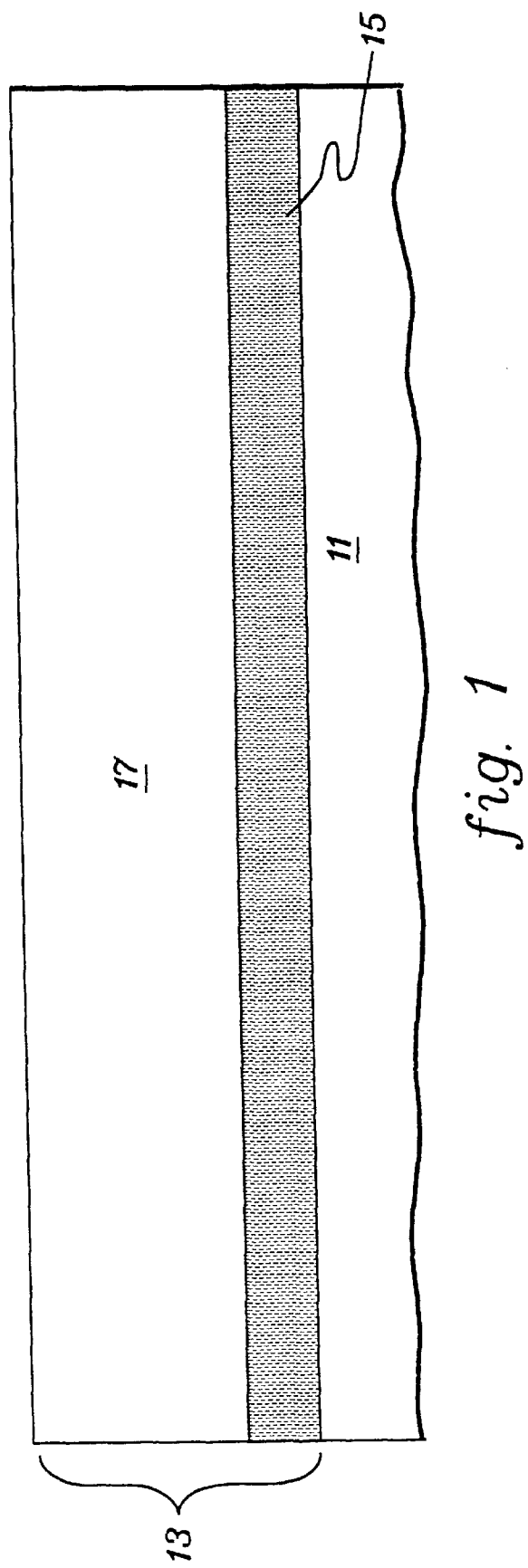
FIG. 1 is a cross-sectional view of a micro-electronic assembly after a first step in one embodiment of a fabrication process of an SRAM cell in which a first silicon-on-insulator ("SOI") layer is deposited on a substrate pursuant to the present invention.
Figure 2:
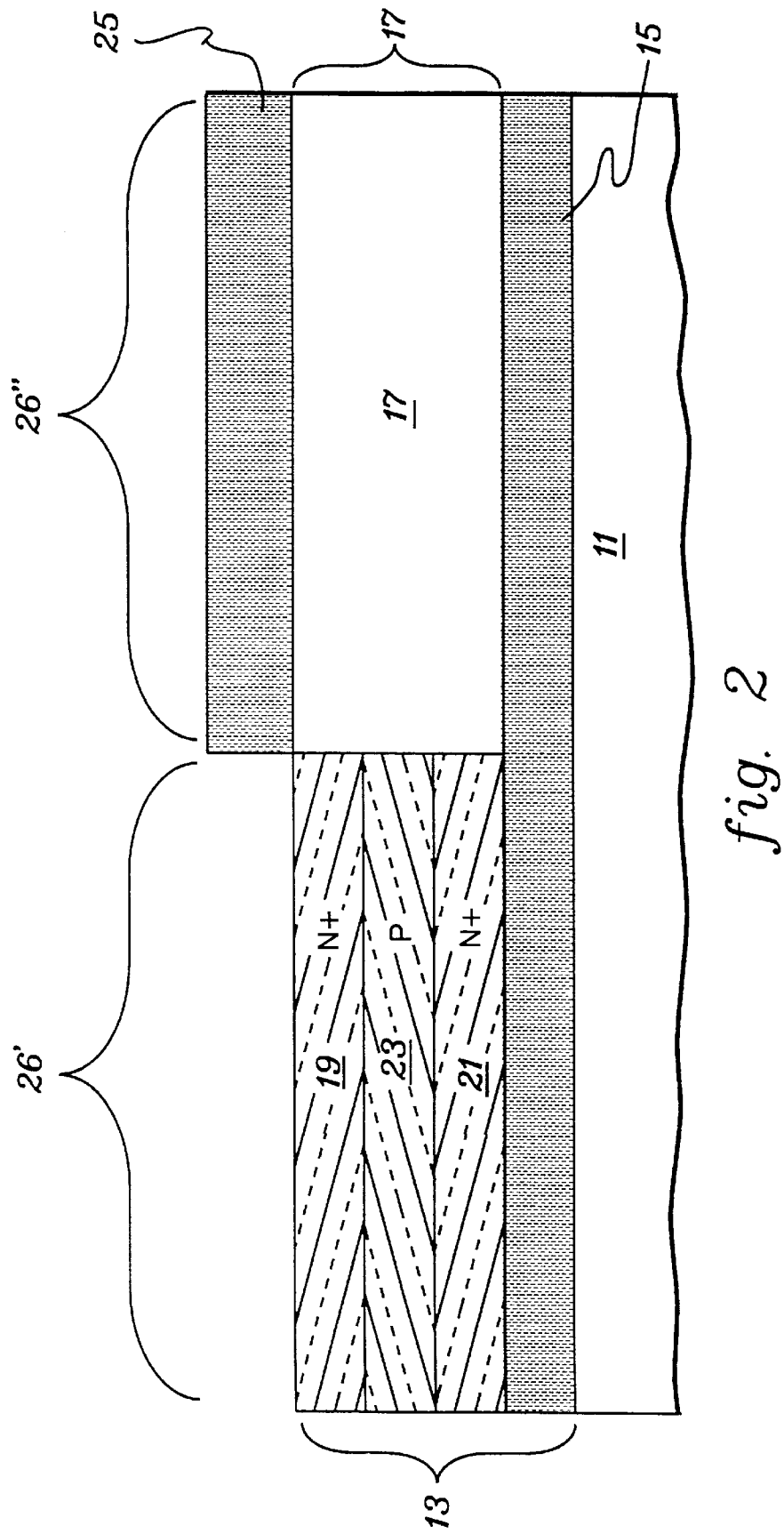
FIG. 2 is a cross-sectional view of the assembly of FIG. 1 subsequent to the doping of regions of a first transistor in conformance with one embodiment of the present invention.
Figure 3:
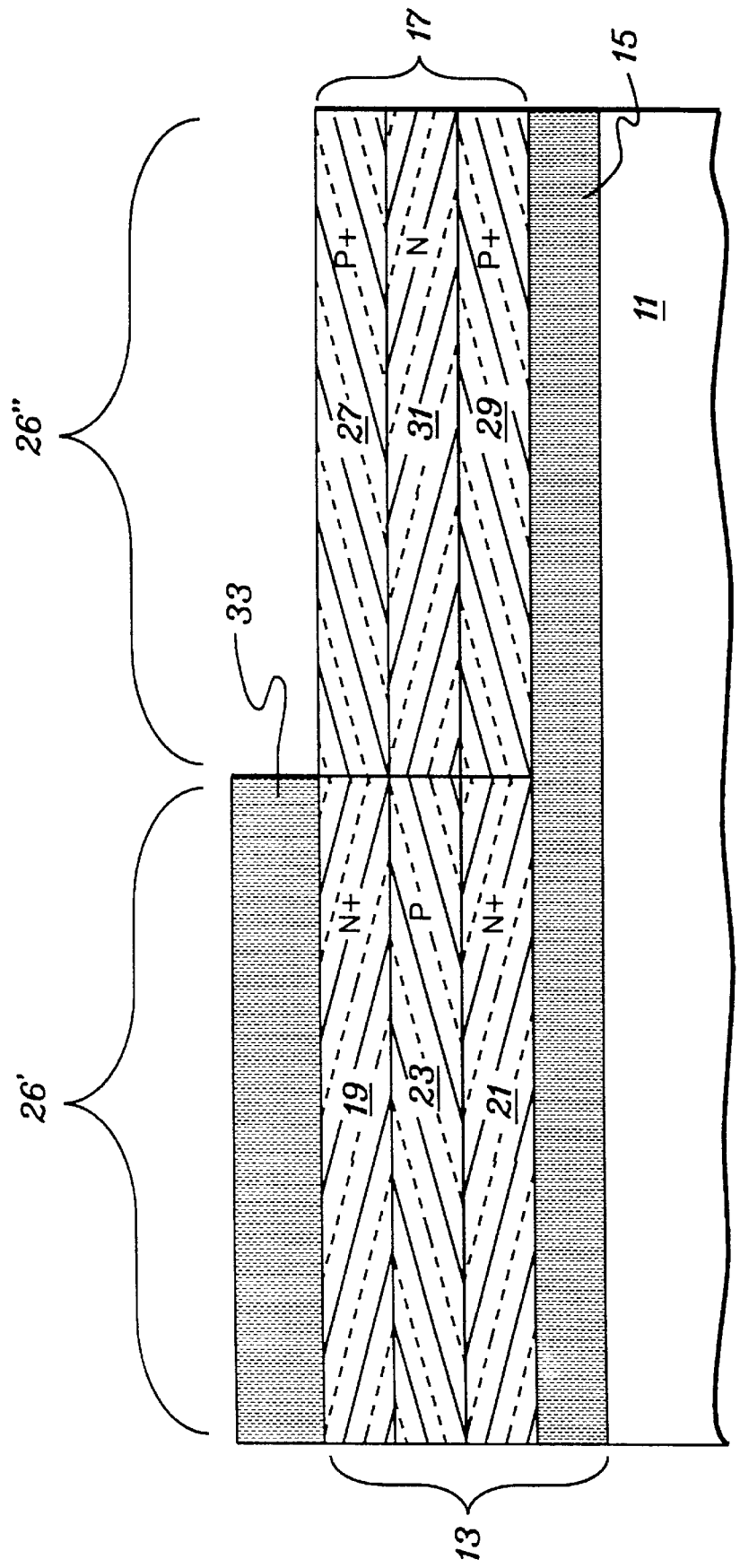
FIG. 3 is a cross-sectional view of the assembly of FIG. 2 after the doping of regions of a second transistor in accordance with an embodiment of the present invention.

Referring to FIG. 1, substrate 11 provides a base support structure for the SRAM trench cell. The substrate may be composed of a conventional substrate material such as, for example, silicon. Thereabove, first silicon-on-insulator ("SOI") layer 13 is formed. Specifically, a suitable method for forming the SOI layer is described in an article entitled "Silicon On Insulator (SOI) by Bonding and Etch-Back," J. Lasky et al., presented at IEDM Conference, December 1985 and hereby incorporated herein by reference. As shown, the first SOI layer 13 includes silicon layer 17 disposed above insulating layer 15 (composed of, for example, silicon dioxide—$SiO_2$), while the entire first SOI layer 13 is disposed on substrate 11.

Next, a liftoff mask 25 (FIG. 2) is placed upon first SOI layer 13 so as to cover one portion 26" of the first SOI layer and expose another portion 26'. The silicon layer 17 of exposed portion 26' is implanted to form doped regions at desired locations within SOI silicon layer 17 for n-channel FET devices. Specifically, N+ source doped region 19 is implanted with, for example, a low energy arsenic implant. A typical depth for this implantation may be approximately 0.25 μm below the surface of silicon layer 17 of the first SOI layer An N+ drain doped region 21 is then implanted with, for example, another arsenic implant. This implant should be deeper than source doped region 19 and may be, for example, 0.95 μm below the surface of silicon layer 17. A boron implant is then used to establish the FET channel concentration within P-doped region 23. Peak concentration may, for example, be centered in the middle of silicon portion 17 of first SOI layer 13. Thus, the doped regions for an n-channel FET device have been created.

Conventional lift-off masking techniques are subsequently used to create lift-off mask 33 (FIG. 3) covering the implanted portion 26' and exposing nonimplanted portion 26" of silicon layer 17 of the first SOI layer 13. Specifically, a lift-off masking material such as aluminum ("Al") may be deposited above lift-off mask 25 and first SOI layer 13 shown in FIG. 2. The lift-off mask 25 is then removed, leaving the Al lift-off mask 33 covering the previously implanted portion 26'.

Another doping process may next be used to create a p-channel device in exposed portion 26" of silicon layer 17. In particular, boron is implanted at, for example, a depth of 0.25 μm to create a P+ source doped region 27. Boron may again be implanted at a depth of, for example, 0.95 μm to form P+ drain doped region 29. Phosphorous may then be implanted approximately between the source 27 and drain 29 regions to establish the FET channel concentration within the doping region 31. The mask material is then stripped, revealing silicon layer 17 containing adjacent p-channel and n-channel type FET doped layers.

Figure 4:
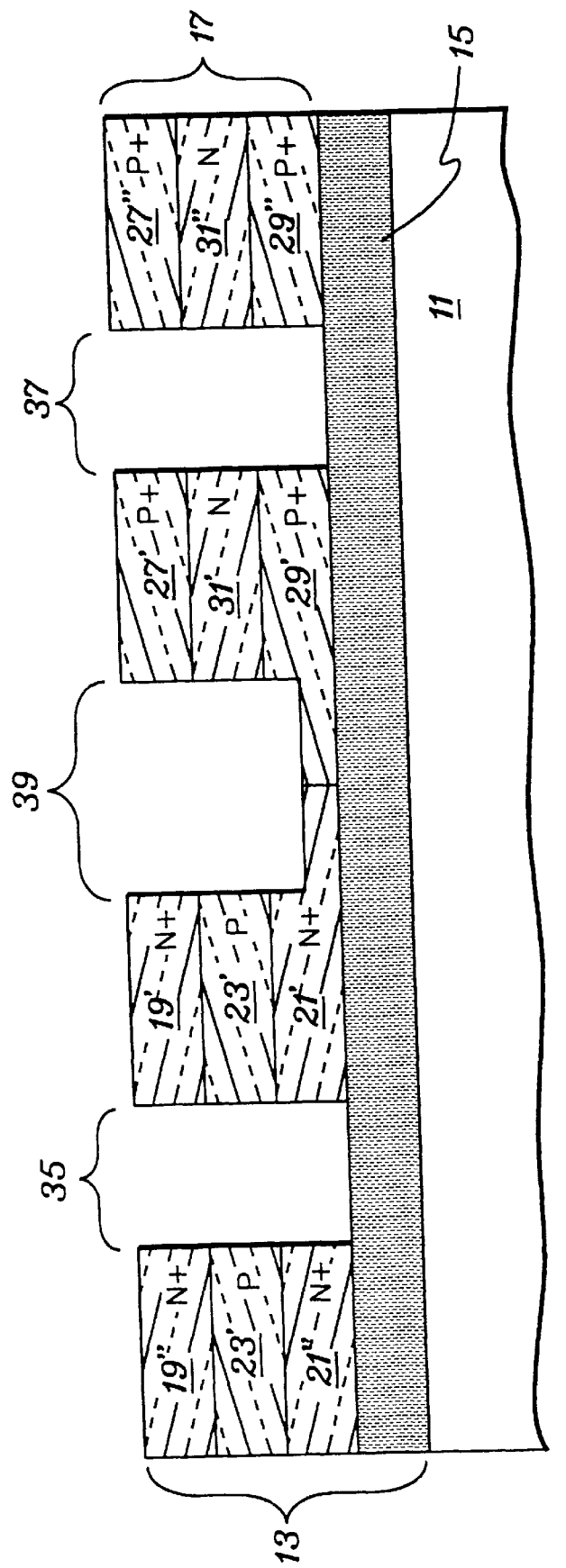
FIG. 4 is a cross-sectional view of the assembly of FIG. 3 subsequent to the formation of rail and active trenches pursuant to one embodiment of the present invention.

The process continues with the formation of trenches within silicon layer 17 of first SOI layer 13 (FIG. 4). In particular, a two-step masking and etching process is used to create the three trenches shown. A first mask is defined which permits etching of P+ rail trench 35 and N+ rail trench 37, and etching is performed to a depth within the top doped regions 19' and 27'. This depth may be, for example, 0.3 μm deep. Active trench 39 is then exposed (along with the P+ and N+ rail trenches) using a second mask, and etching continues such that P+ rail trench 35 and N+ rail trench 37 are etched to insulating layer 15 of first SOI layer 13. Active trench 39 simultaneously etches to a location above SOI insulating layer 15 as shown. To further explain, because the etching of the rail trenches 35 and 37 was started first (in the first mask/etch step) the rail trenches will etch "ahead" of active trench 39. Thus, because etching is stopped when the rail trench etch reaches insulating layer 15, the active trench 39 etch stops short of insulating layer 15. The active and rail (P+ and N+) trenches are thus defined within the first SOI layer.

Figure 5:
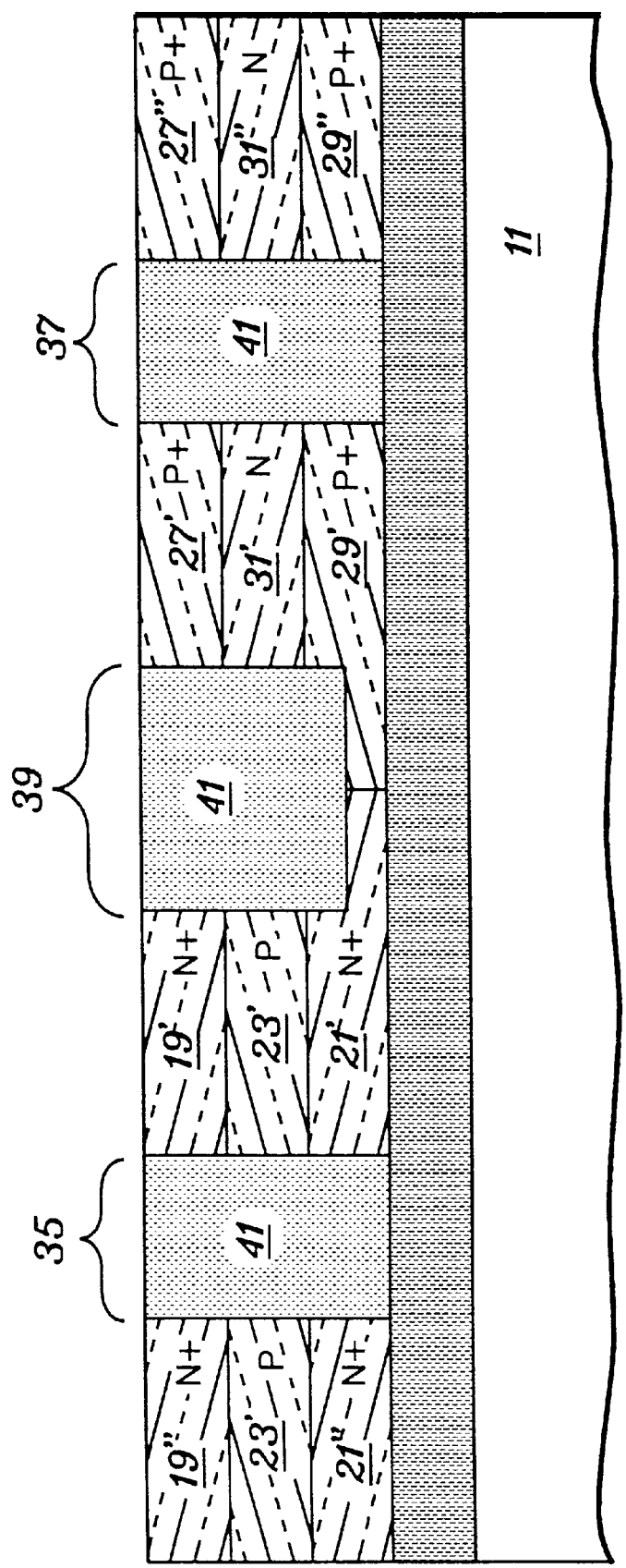
FIG. 5 is a cross-sectional view of the assembly of FIG. 4 after deposition and planarization of a passivation oxide in the trenches in conformance with an embodiment of the present invention.
Figure 6:
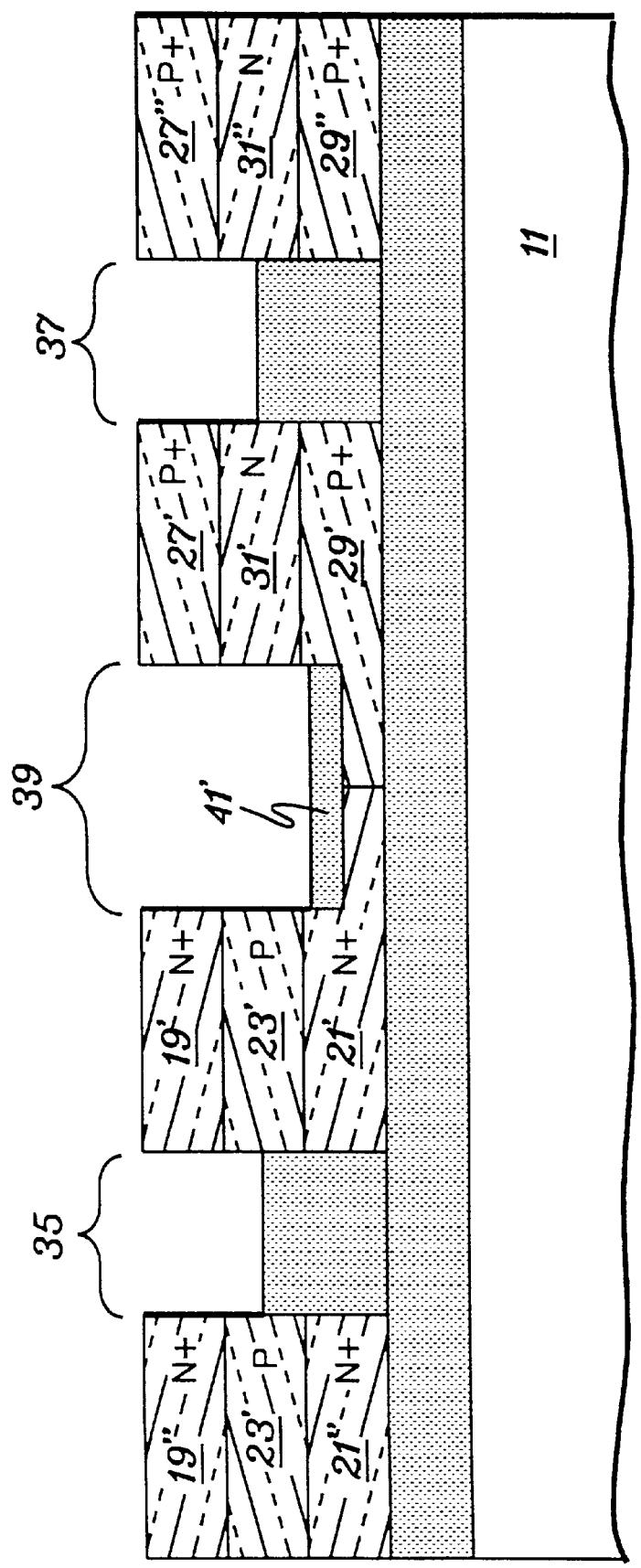
FIG. 6 is a cross-sectional view of the assembly of FIG. 5 after recessing of the passivation oxide contained within the trenches according to an embodiment of the present invention.

To continue with the process, passivation oxide 41 is deposited in the three trenches, filling them, and is then planarized (FIG. 5). A selective etch is used to recess oxide 41 within all three trenches to the center of channel regions 23' and 31', i.e., a depth of, for example, approximately 0.6 μm (FIG. 6). This is the depth of the oxide within the P+ rail trench 35 and N+ rail trench 37 as shown. The rail trenches (35 and 37) are then masked, and the oxide within active trench 39 is further recessed such that some oxide 41' remains over the junction of doped regions 21' and 29'. The mask may then be removed, completing formation of the oxide spacers in the trenches.

Figure 7:
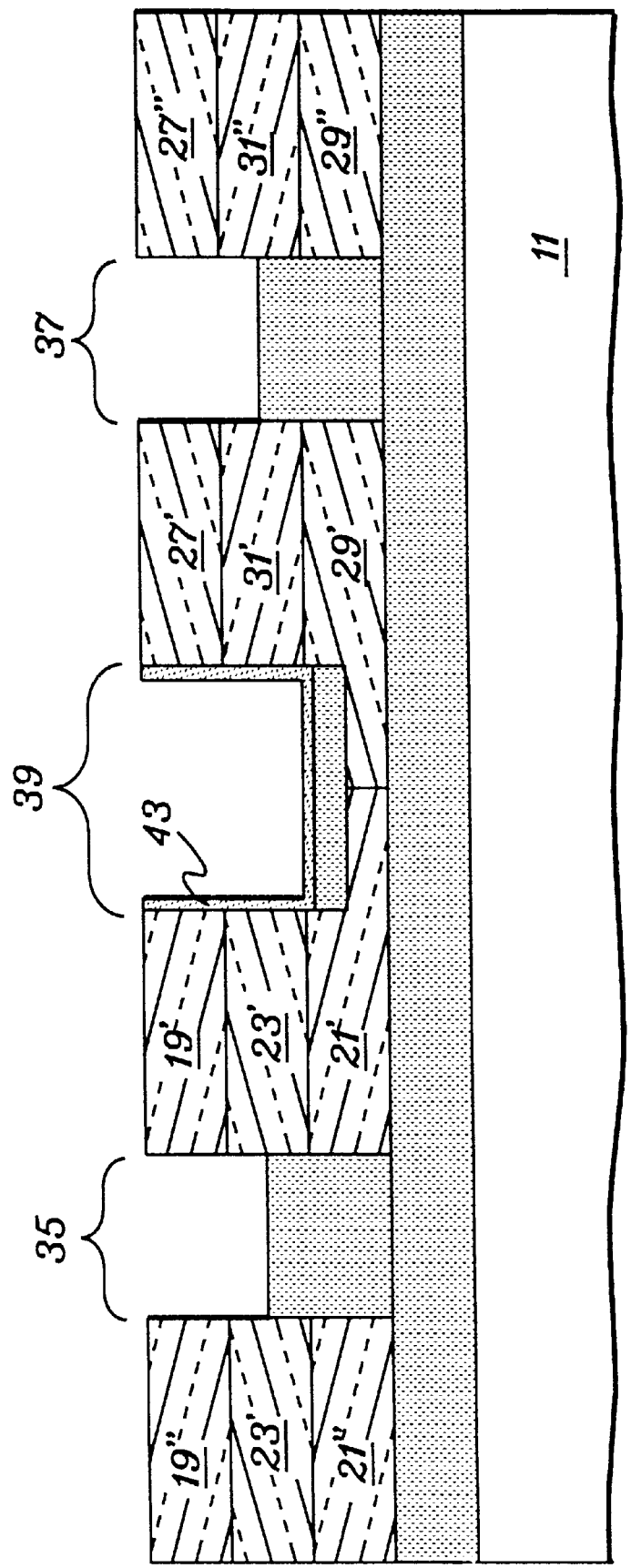
FIG. 7 is a cross-sectional view of the assembly of FIG. 6 subsequent to the formation of a gate dielectric oxide layer on the sidewalls of the active trench in conformance with one embodiment of the present invention.
Figure 8:
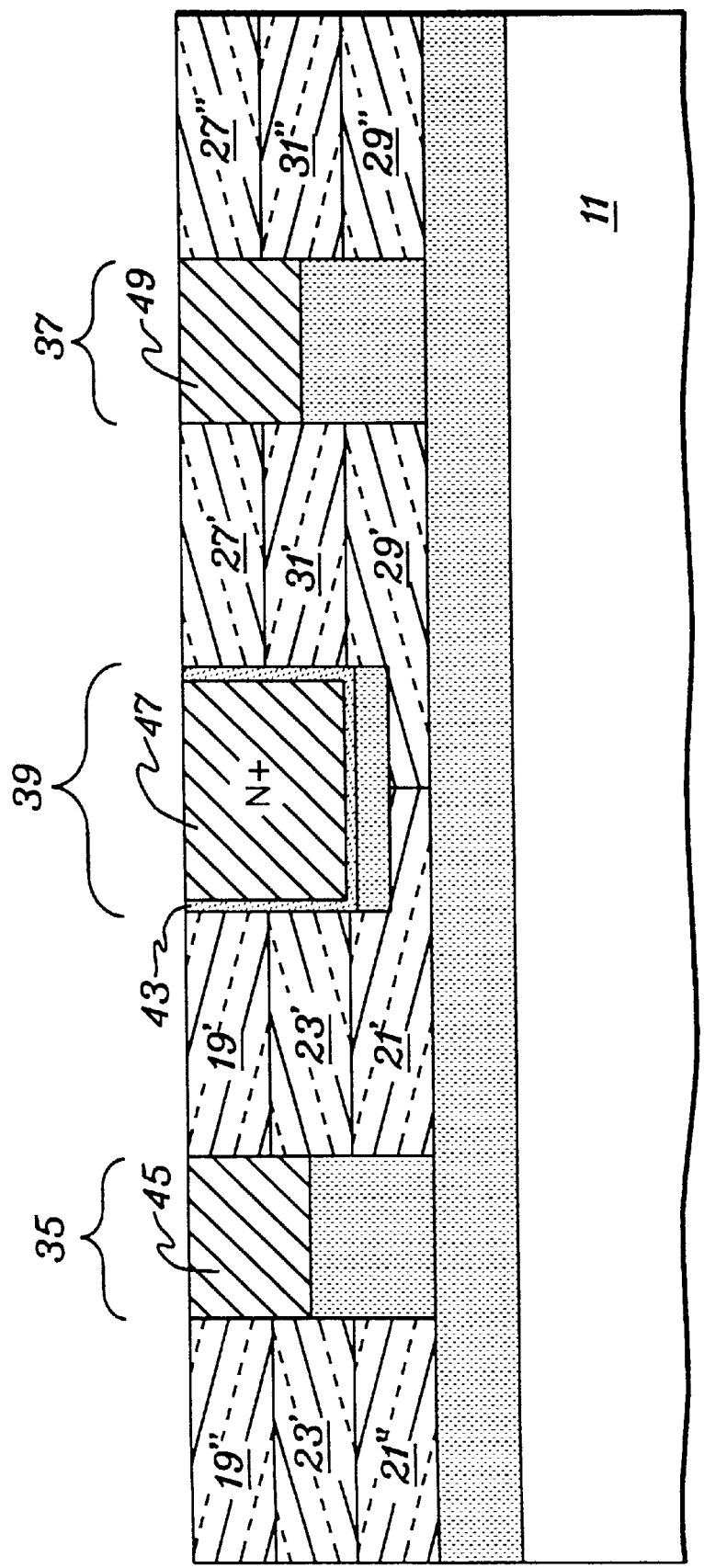
FIG. 8 is a cross-sectional view of the assembly of FIG. 7 after filling of the trenches with polysilicon pursuant to an embodiment of the present invention.

A next process step involves the formation of a gate dielectric in active trench 39. Accordingly, the sidewalls within the three trenches are oxidized to form thin gate dielectric layer 43 (FIG. 7). Active trench 39 is then masked, and gate dielectric layer 43 is removed from the sidewalls of rail trenches 35 and 37 using, for example, a hydrofluoric ("HF") acid dip. The mask is removed, leaving gate dielectric 43 remaining on the interior sidewalls of active trench 39.

To proceed, polysilicon fill material 45, 47 and 49 (FIG. 8) is deposited within the three trenches and planarized. It should be generally noted that a masking/implantation process may be required to dope the polysilicon of the P+ rail trench 45 differently than the polysilicon contained within the other trenches in order to provide good electrical contact through the P+ rail trench to the FET doped regions disposed adjacent thereto. Regardless, masking and implementation process are used to provide an N+ doping in N+ rail trench 37 and active trench 39, and a P+ doping in P+ rail trench 35 to facilitate conductivity. Optionally, tungsten could be utilized as a fill material (in place of polysilicon), to provide improved conductivity.

Figure 9:
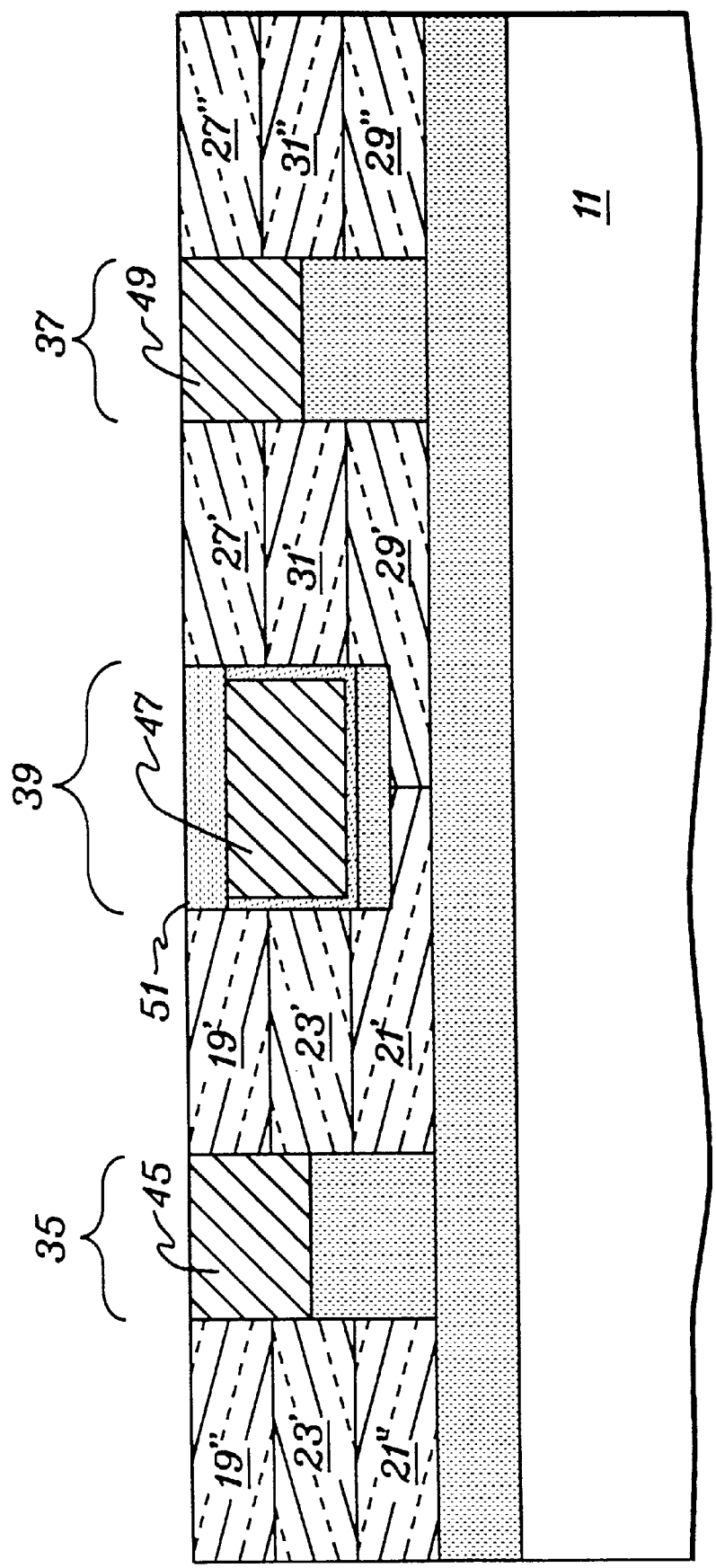
FIG. 9 is a cross-sectional view of the assembly of FIG. 8 subsequent to the formation of a spacer at the top of the active trench in conformance with an embodiment of the present invention.
Figure 10:
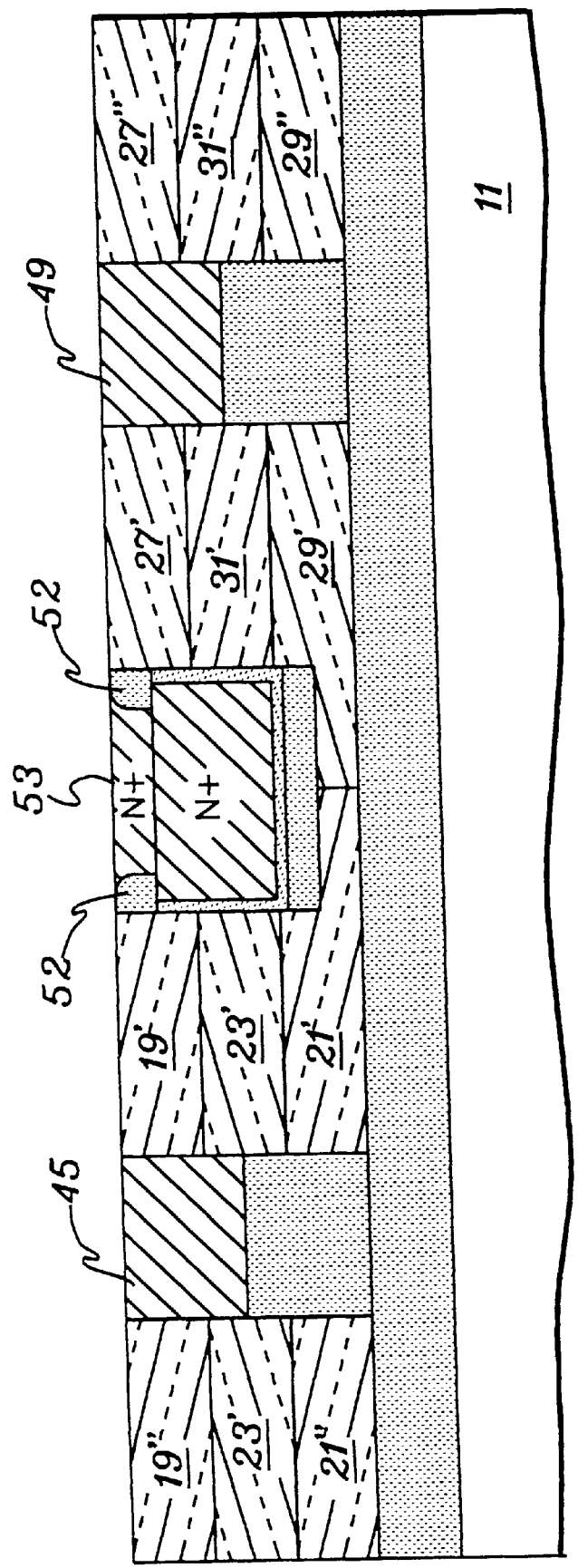
FIG. 10 is a cross-sectional view of the assembly of FIG. 9 subsequent to the etching of the active trench top spacer and filling of the active trench with polysilicon in accordance with one embodiment of the present invention.

Using standard mask/etch processes, polysilicon 47 and gate dielectric layer 43, within active trench 39, are recessed approximately to the middle of top doped regions 19' and 27' (FIG. 9). Thereafter, oxide spacer 51 is deposited and planarized. A further mask/etch process may then be performed on oxide spacer 51 so as to form small spacers 52 associated with the sidewalls of active trench 39 (FIG. 10). Subsequently, polysilicon layer 53 is deposited, filling the trench, and planarized. A masked implantation process may then be used to provide an N+ doping for conductivity in polysilicon 53 Optionally, the polysilicon could be deposited already doped.

Figure 11:
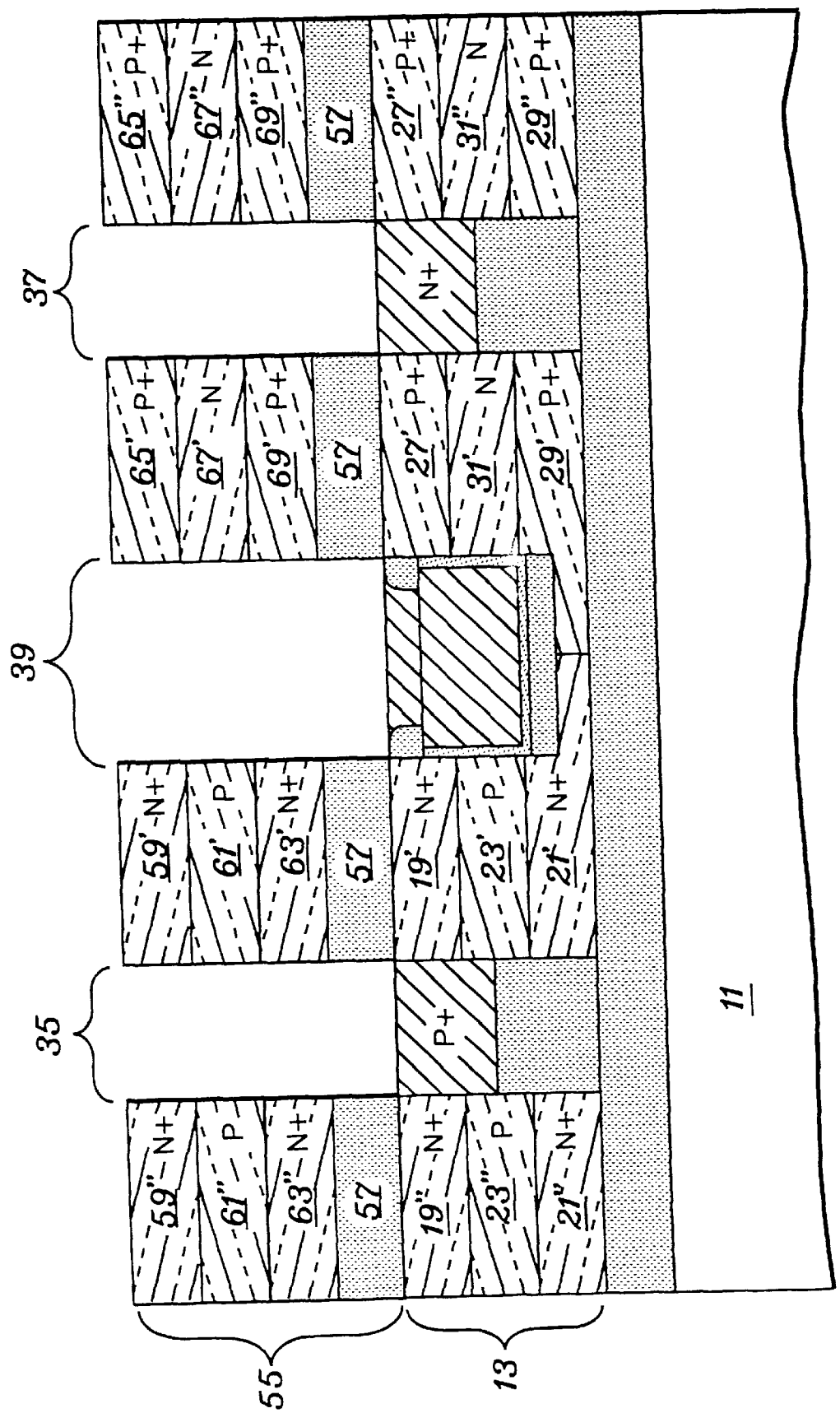
FIG. 11 is a cross-sectional view of the assembly of FIG. 10 subsequent to the deposition, implantation and etching of a second SOI layer pursuant to an embodiment of the present invention.
Figure 12:
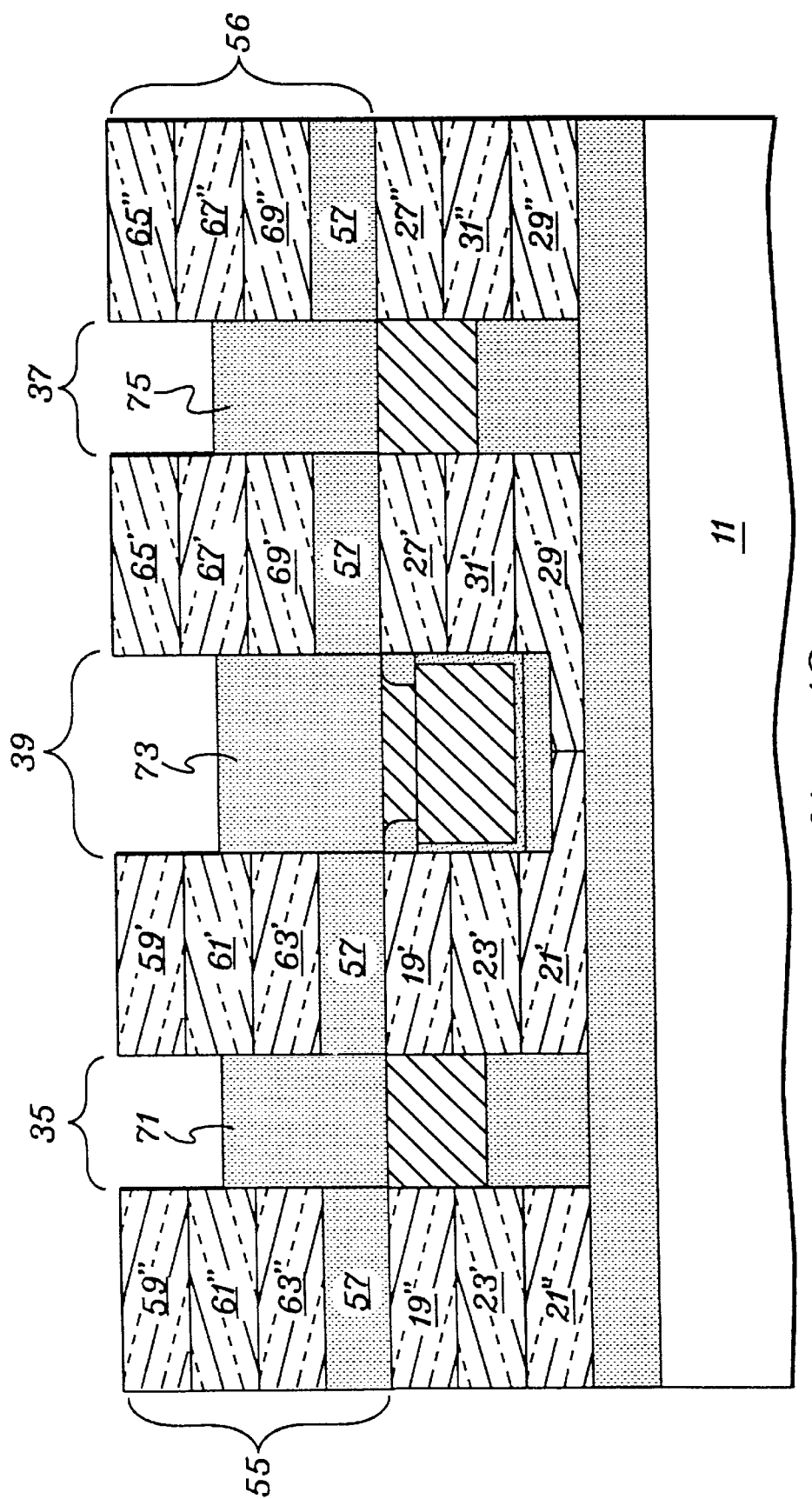
FIG. 12 is a cross-sectional view of the assembly of FIG. 11 subsequent to the formation of recessed spacers in the trenches in conformance with one embodiment of the present invention.
Figure 13:
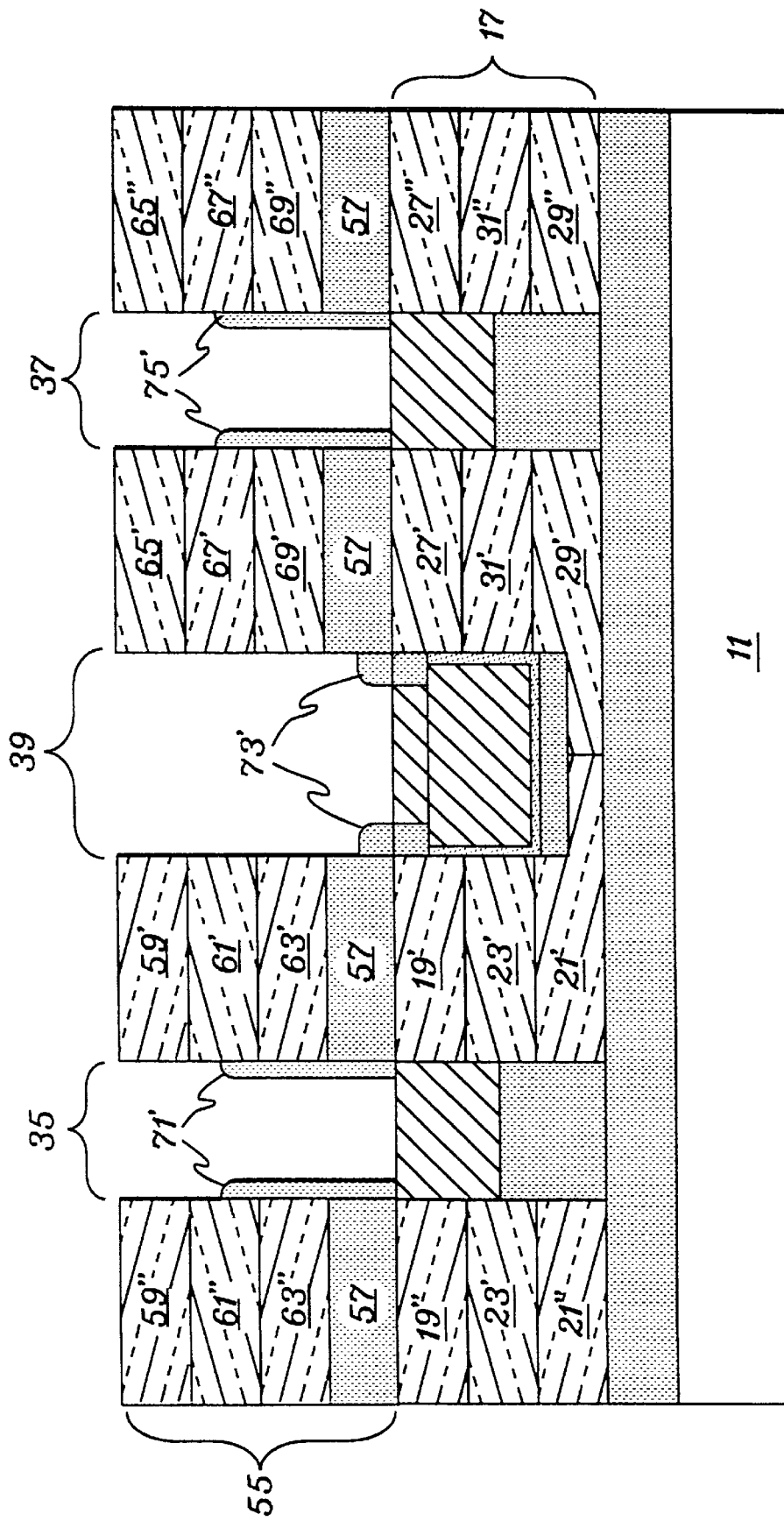
FIG. 13 is a cross-sectional view of the assembly of FIG. 12 after the formation of recessed sidewall spacers within the trenches in accordance with one embodiment of the present invention.
Figure 14:
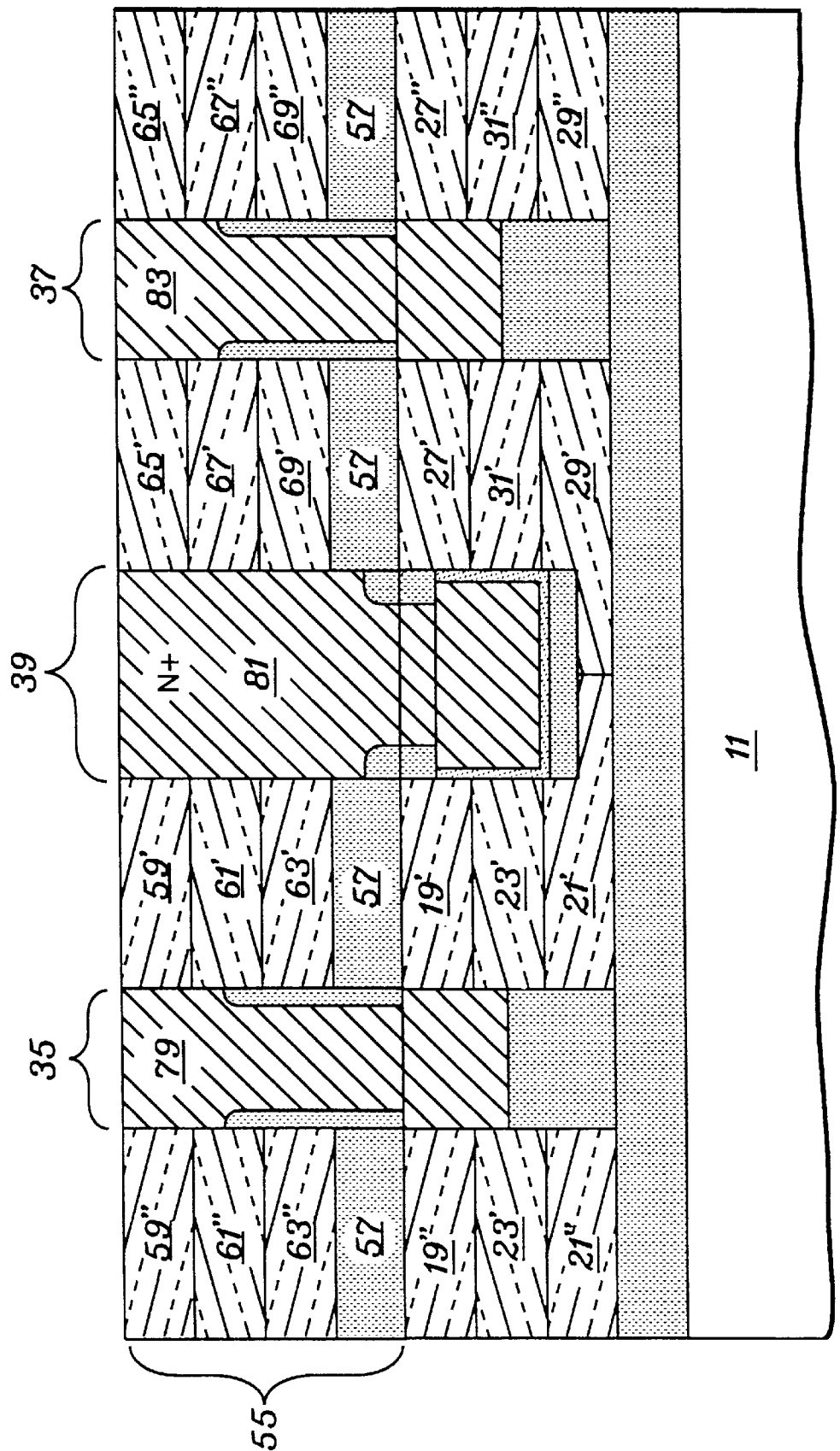
FIG. 14 is a cross-sectional view of the assembly of FIG. 13 subsequent to the filling of the trenches with polysilicon pursuant to an embodiment of the present invention.

Second SOI layer 55 is then formed on first SOI layer 13 (FIG. 11). Regions are doped, and trenches are etched as previously discussed hereinabove with respect to first SOI layer 13. Specifically, N+ source region 59 (59' and 59") and N+ drain region 63 (63' and 63") are implanted along with p-doped region 61 (61' and 61"). Moreover, P+ source region 65 (65' and 65") and P+ drain region 69 (69' and 69") are implanted, along with n-doped region 67 (67' and 67"). SOI insulator layer 57 separates the upper transistor doped regions from the lower transistor doped regions; and trenches 35, 37 and 39 are defined and etched being aligned to the pre-existing trenches below.

The process continues with the deposition of oxide spacer material 71, 73 and 75 (FIG. 12) within the three trenches, and subsequent recessing thereof. Such recessing may be performed using, for example, a selective etch and is performed to the center of channel regions 61' and 67' of top SOI silicon layer 56.

A conventional multi-level resist ("MLR") process may then he used to create oxide spacers 71', 73' and 75' (FIG. 13) on the sidewalls of the three trenches. A process for performing such a MLR is described in U.S. Pat. No. 5,096,849, entitled "Process For Positioning A Mask Within A Concave Semiconductor Structure," issued Mar. 17, 1992, and hereby incorporated herein by reference. The active trench spacers 73' are formed to provide a short spacer at the interface of the first SOI layer's silicon layer 17 and the second SOI layer's oxide layer 57 to provide protection against shorts.

Figure 15:
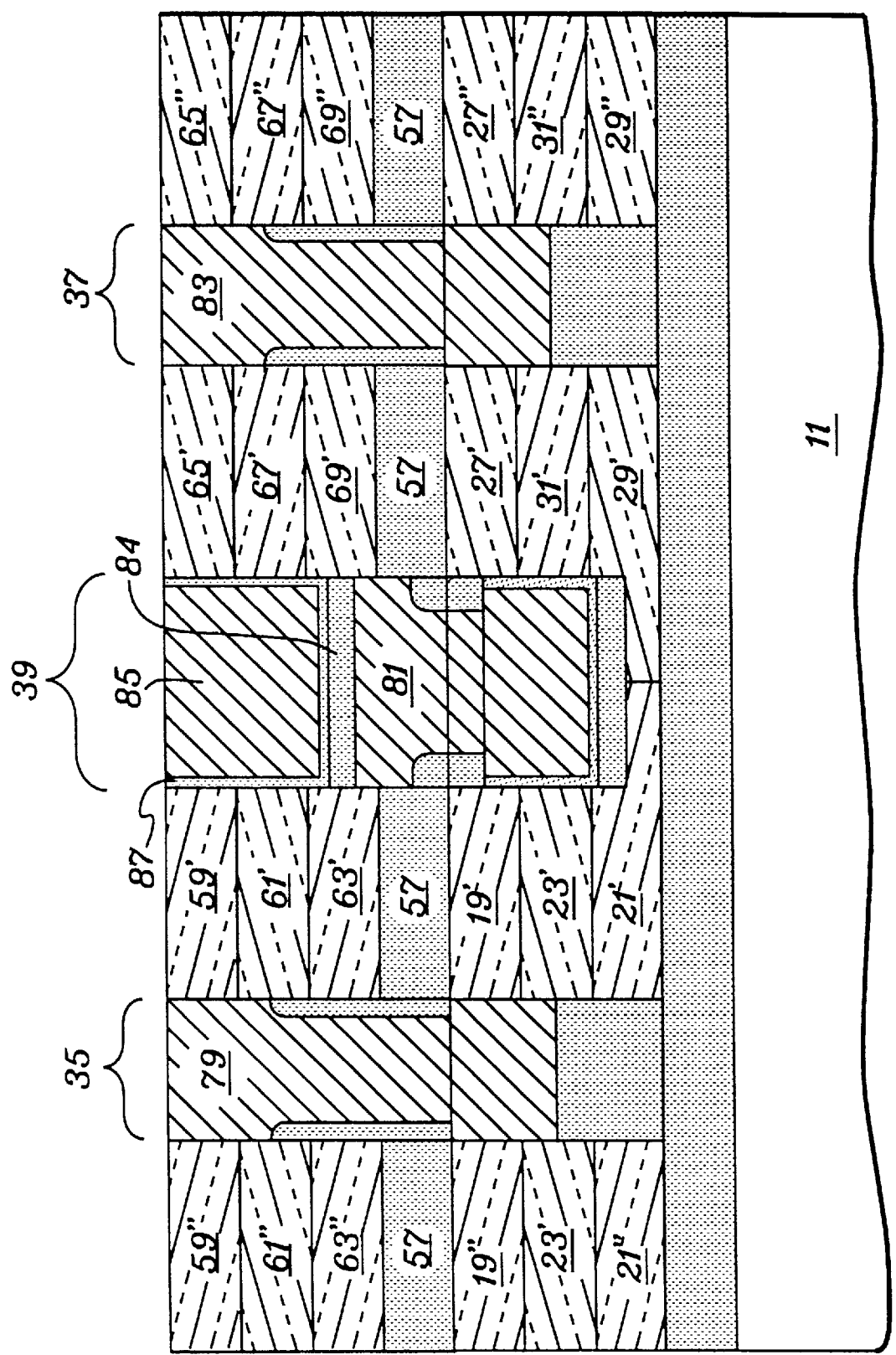
FIG. 15 is a cross-sectional view of the assembly of FIG. 14 subsequent to the formation of an oxide spacer, gate insulator and polysilicon fill within the active trench in conformance with one embodiment of the present invention.

To continue with the process, polysilicon fill 79, 81 and 83 (FIG. 14) is deposited within the three trenches, filling them. Thereafter, the surface of the structure is planarized. With the N+ and P+ rail trenches masked, polysilicon fill 81 in active trench 39 is recessed (etched) such that it is level with the center of doped regions 63' and 69' of SOI layer 55 (FIG. 15, bottom of spacer 84). Oxide spacer 84 is then formed within the active trench using, for example, a deposition or oxidation process. The mask is then stripped and gate oxide 87 is grown, conformally filling the active trench. Thereafter, polysilicon fill 85 is deposited within the active trench, filling it and the structure is planarized. Furthermore, at this stage in the process, polysilicon fill 85 within active trench 39 and polysilicon fill 83 within N+ rail trench 39 are doped with an N dopant to produce N+ doped regions therein for increasing conductivity.

Figure 16A:
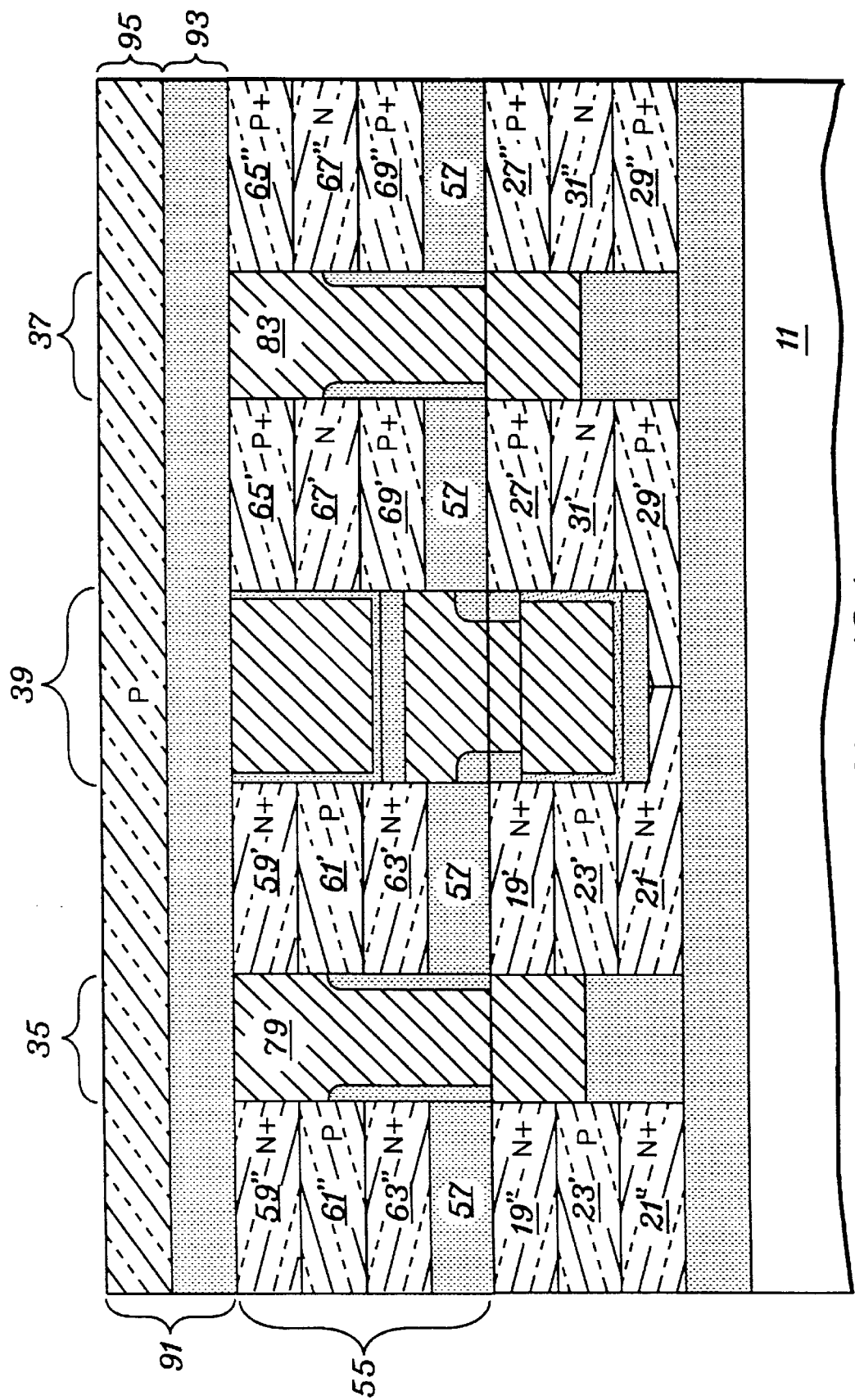
FIG. 16A is a cross-sectional view of the assembly of FIG. 15 after deposition of a third SOI layer pursuant to one embodiment of the present invention.
Figure 16B:
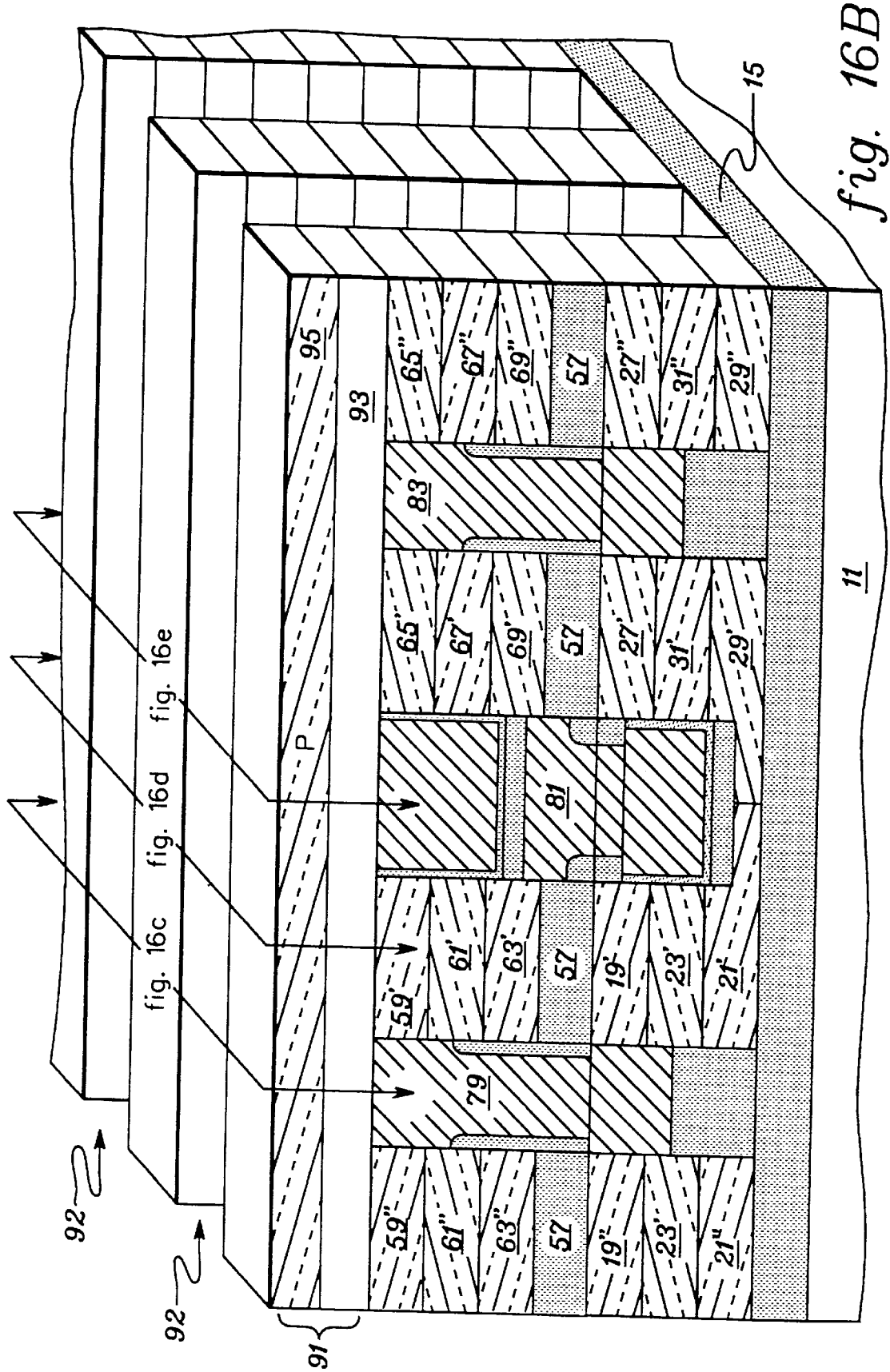
FIG. 16B is a cross-sectional perspective view of the assembly of FIG. 16A subsequent to the formation of isolation trenches between adjacent memory cells according to an embodiment of the present invention.
Figure 16C:
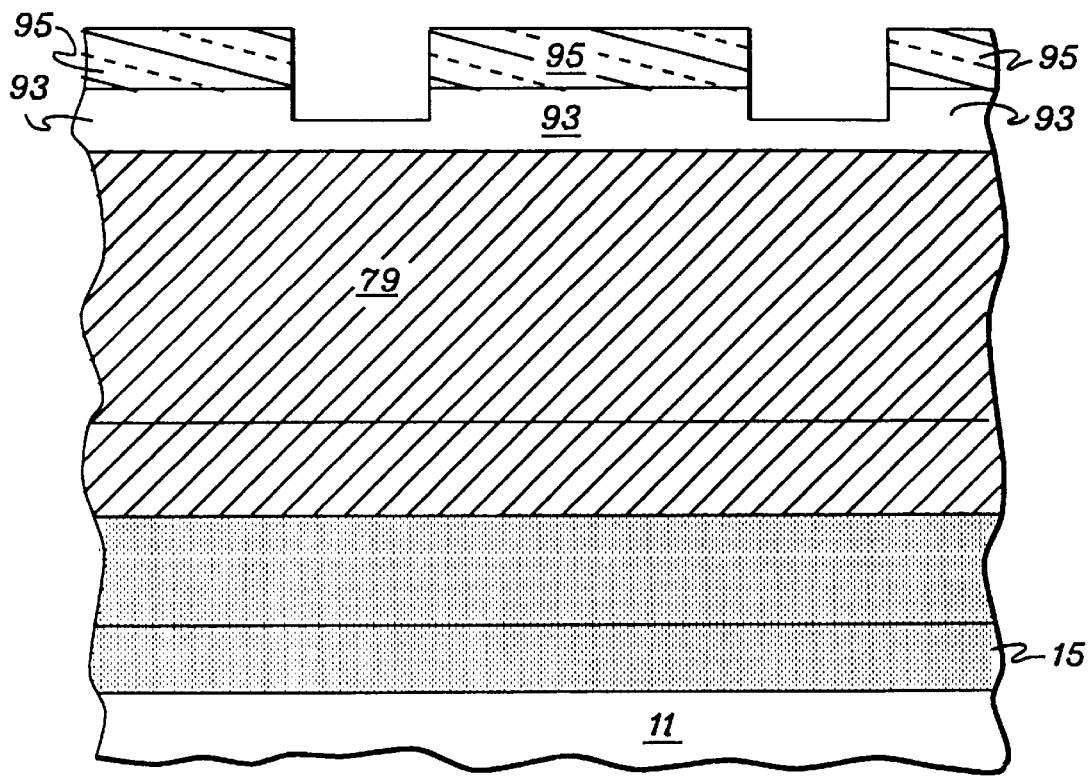
FIGS. 16C–E are cross-sectional views of the assembly of FIG. 16B.

A third SOI layer 91 is next formed on top of second SOI layer 55 (FIG. 16A). Third SOI layer 91 includes silicon layer 95 and insulating layer 93. In this particular case, silicon layer 95 of third SOI layer 91 is pre-doped as a P-type semiconductor (alternatively, doping could be performed after deposition). Isolation trenches 92 may now be etched (FIG. 16B). The isolation trenches are orthogonal to the rail and active trenches and will provide isolation between memory cells along the active/rail trench sidewalls.

Figure 16D:
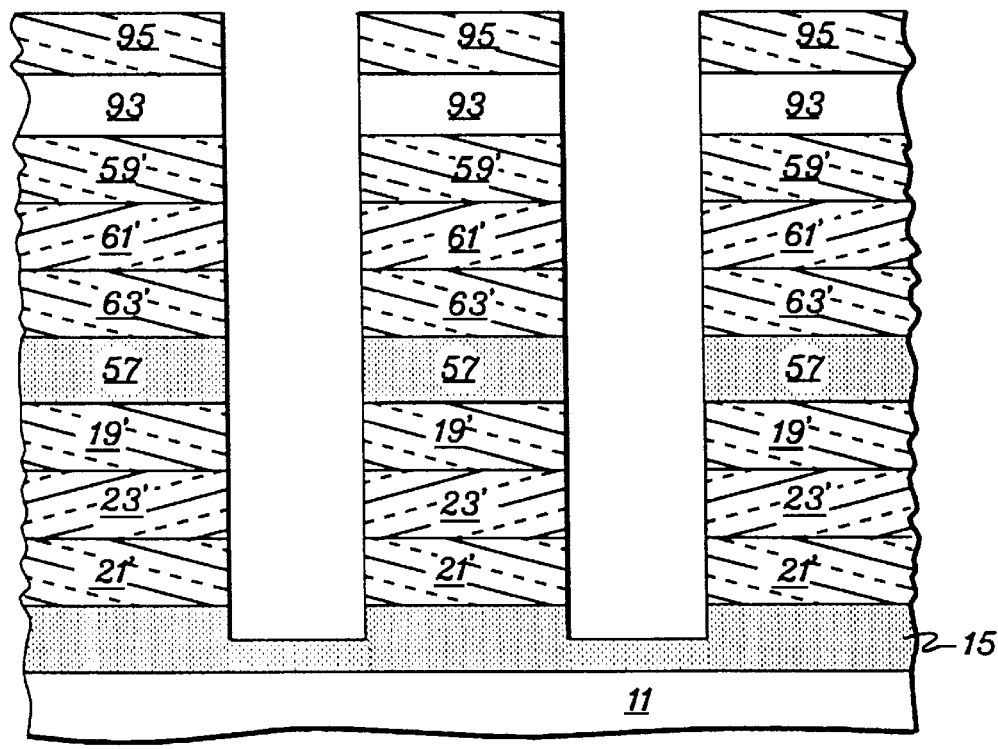
Figure 16E:
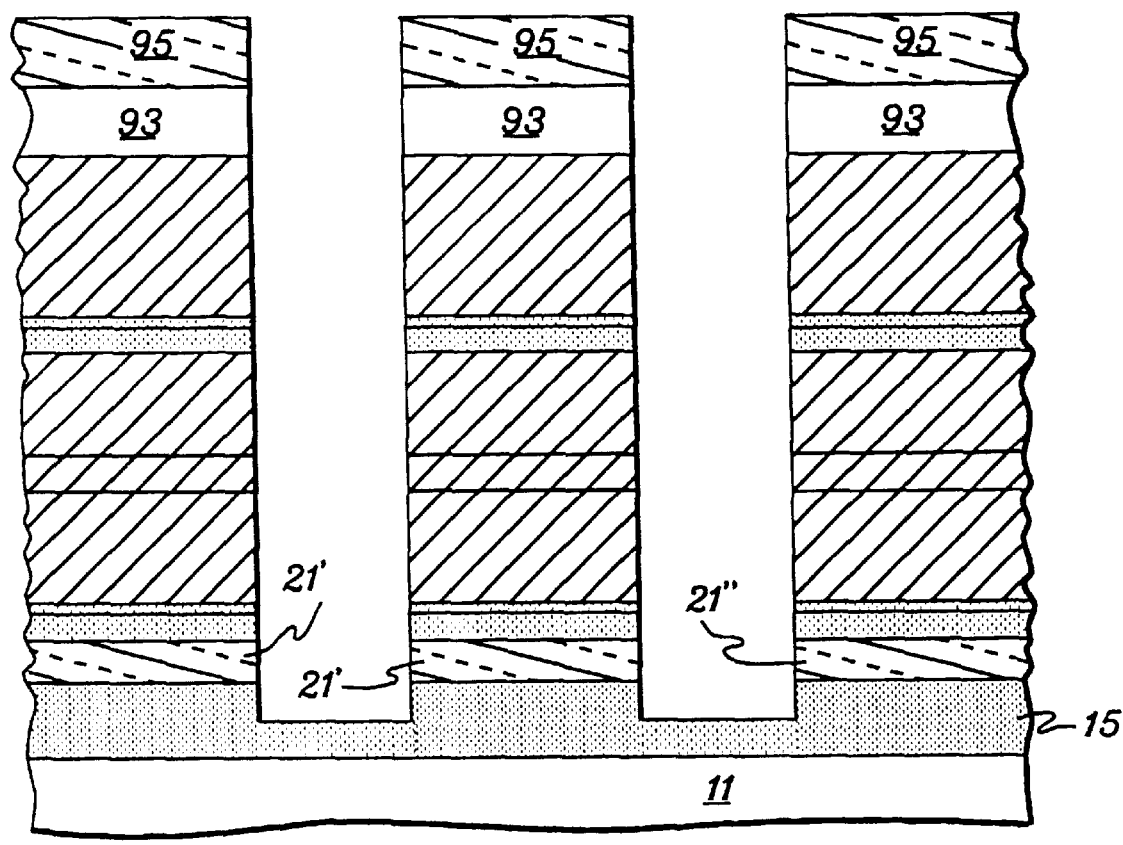
Figure 16F:
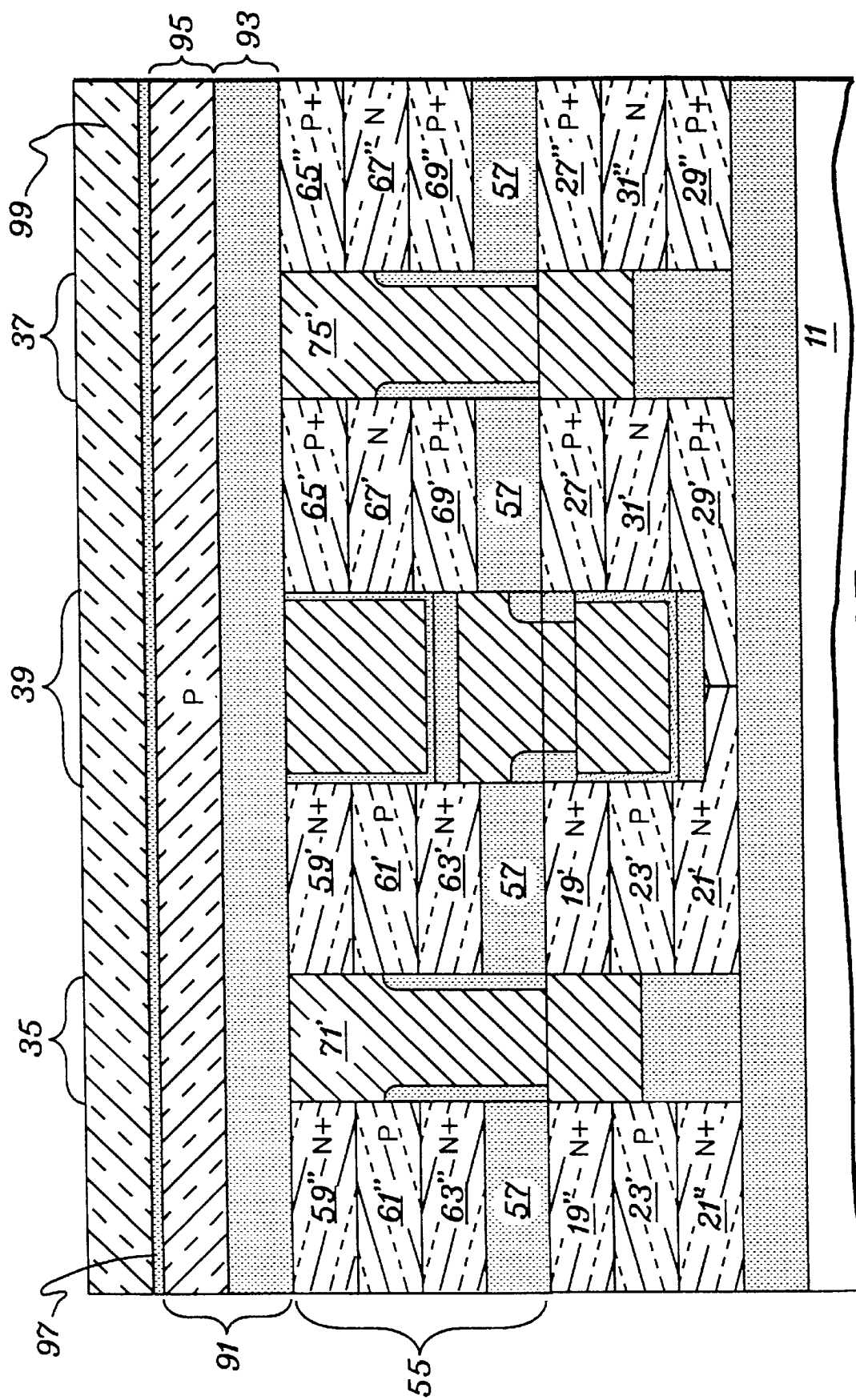
FIG. 16F is a cross-sectional view of the assembly of FIG. 16B subsequent to the formation of a gate oxide layer and a polysilicon wordline layer thereabove, pursuant to an embodiment of the present invention.

More specifically, etching of the isolation trenches is performed such that isolation between memory cells is achieved while maintaining a continuous P+ and N+ rail between adjacent cells. As shown in the cross-sectional view of FIG. 16C (indicated on FIG. 16B), silicon layer 95 is etched above the P+ rail trench, but the polysilicon fill within the trench that forms the P+ rail is left intact between adjacent cells. This forms a robust rail, i.e. bus, between adjacent memory cells on the wafer. The N+ rail is similarly left intact. In contrast, etching is performed down to the middle of insulating layer 15 of the bottom SOI layer in association with the active trenches and associated FET doped regions (FIGS. 16D–E). Thus, isolation is provided between adjacent memory cells of the IC memory chip while maintaining continuous P+ and N+ rails therebetween.

As a general note, after etching, the isolation trenches are filled and planarized. Isolation trench fill material could comprise, for example, a thermal oxidation of the isolation trench sidewall followed by a polysilicon fill of the trench. (This would require a contact to the isolation trench to tie it to some potential, and capping of the isolation trenches with an insulator.)

After formation of third SOI layer 91, gate oxide layer 97 (FIG. 16F) is grown on the upper surface thereof. This will later serve as the gate insulator of the I/O transistor. Wordline polysilicon layer 99 having a pyrolitic oxide cap (not shown) is then deposited on the gate oxide layer. Wordlines as well as the gate of the I/O transistor will be formed from this polysilicon layer.

Figure 17:
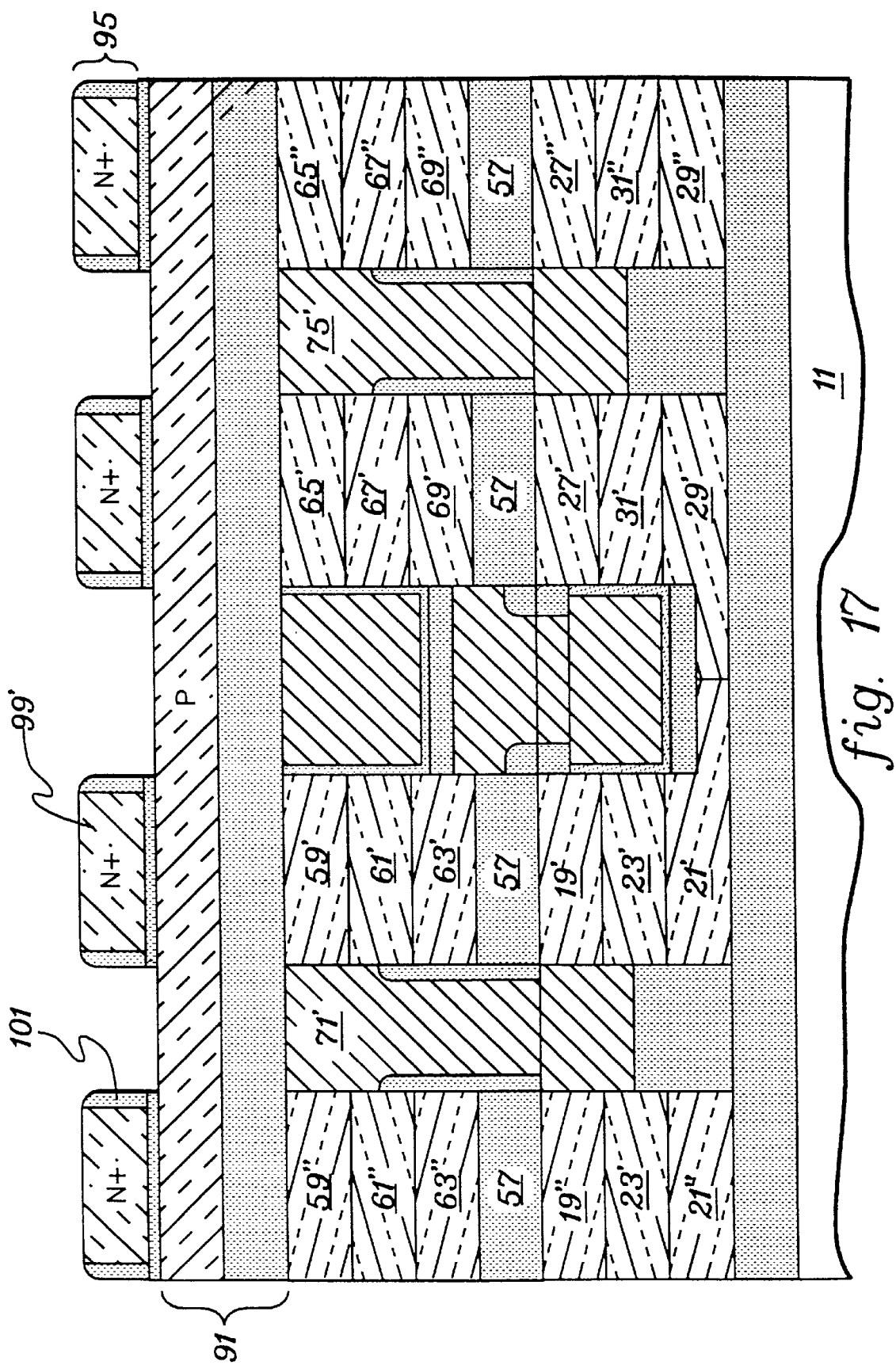
FIG. 17 is a cross-sectional view of the assembly of FIG. 16 after the definition of the polysilicon wordlines and the formation of nitride spacers on the sidewalls thereof in accordance with one embodiment of the present invention.

In a further process step, wordline polysilicon layer 99 is etched, defining individual wordlines (FIG. 17). Thereafter, nitride spacers 101 are formed on the polysilicon wordline sidewalls by, for example, a conventional nitride deposition and reactive ion etching process. In particular, wordline 991, will function as the wordline for the memory cell shown herein. This wordline also electrically functions as the gate of the I/O transistor (recall gate oxide layer 97 therebelow). To facilitate conductivity, silicon layer 99 is implanted with an N+ dopant (e.g., phosphorus) and activated.

Figure 18:
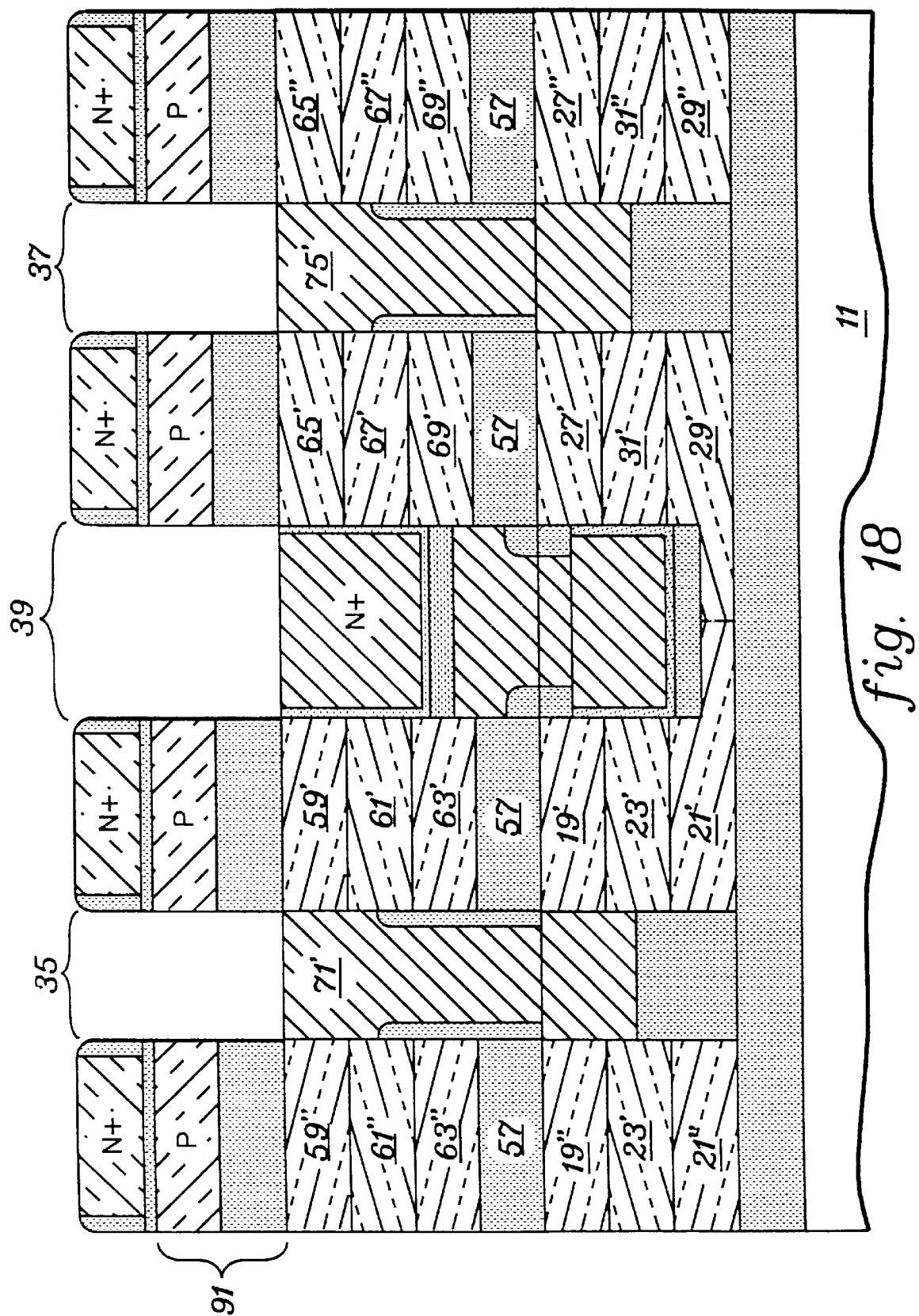
FIG. 18 is a cross-sectional view of the assembly of FIG. 17 after the etching of trenches in the top SOI layer pursuant to an embodiment of the present invention.
Figure 19:
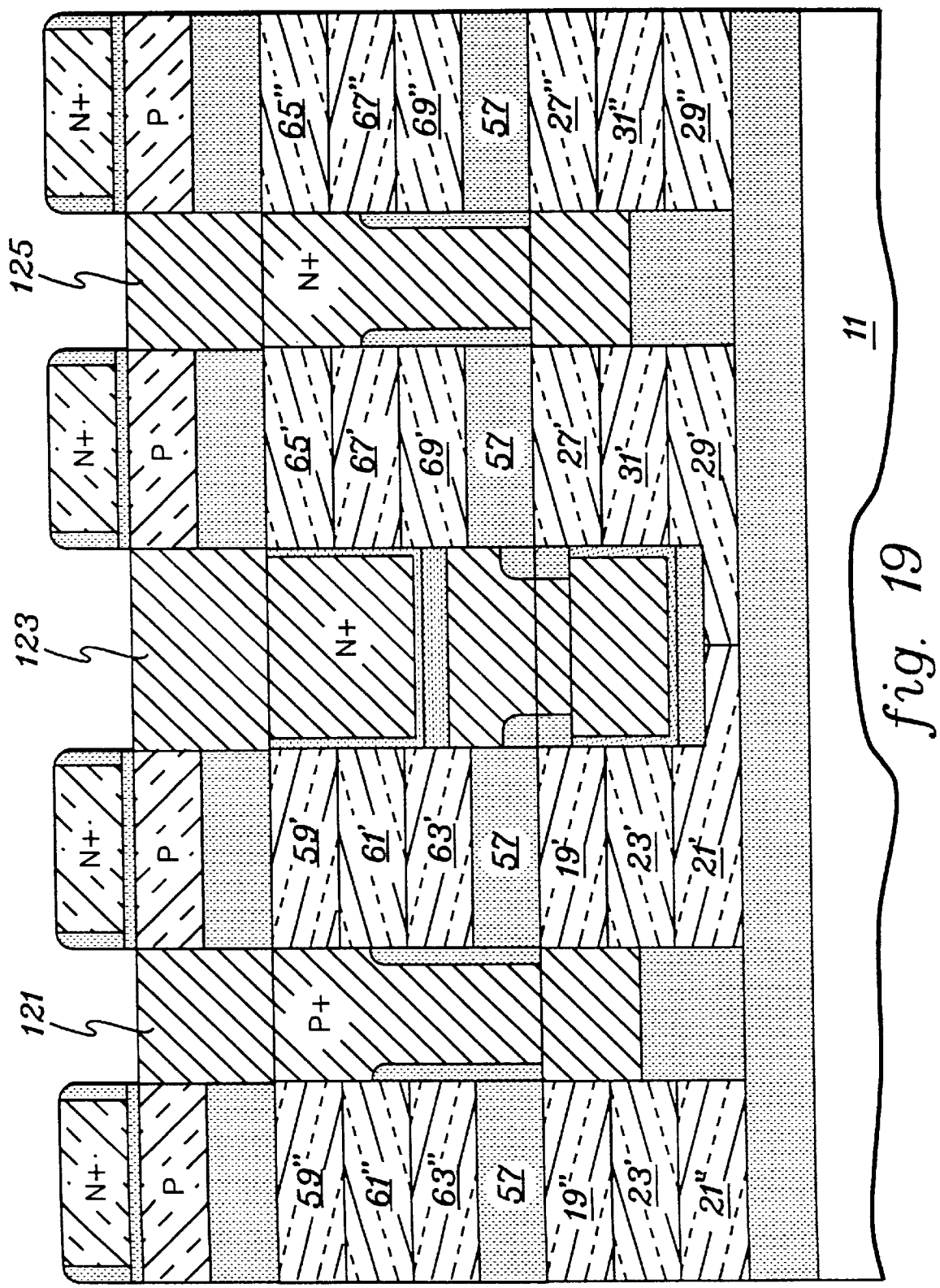
FIG. 19 is a cross-sectional view of the assembly of FIG. 15 subsequent to tilling the trenches with polysilicon in accordance with one embodiment of the present invention.

To continue with a process of the present invention, using the wordlines as a mask, RIE etching is performed to form trenches 35, 37 and 39 through the top SOI layer 91 (FIG. 18). Thereafter, the three trenches are filled with polysilicon 121, 123 and 125, planarized, and recessed to the bottom of the polysilicon wordlines 99' (FIG. 19).

Figure 20:
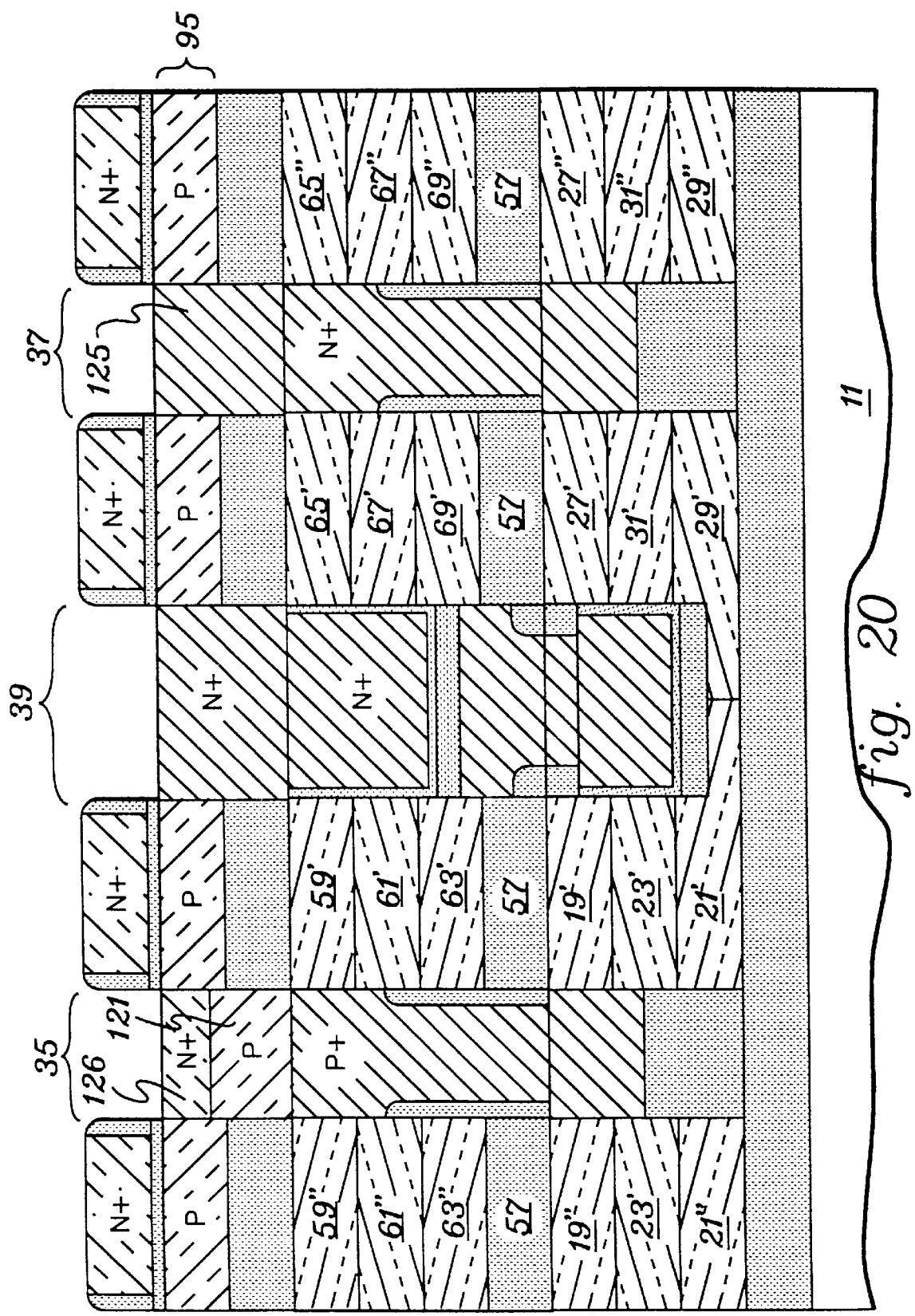
FIG. 20 is a cross-sectional view of the assembly of FIG. 19 subsequent to the formation of a doped polysilicon region in the P+ rail trench in conformance with one embodiment of the present invention.

As a further process step, with respect to FIG. 20, active trench 39 and N+ rail trench 37 are masked. A light, deep P implant using, for example, boron is then performed on polysilicon 121 (FIG. 19) of P+ rail trench 35. Then, a shallow heavy N implant is performed on polysilicon 121 to achieve an N+ doping in top portion 126 thereof. This N+ region will function as the source of the I/O transistor as well as a contact point for a later formed metal bitline.

Further isolation steps regarding the active trenches of adjacent memory cells on the IC chip may be performed next.

I/O transistor source region 126 is isolated between adjacent memory cells. However, etching is only performed through the N+ region 126 of the top polysilicon fill 121 in the P+ trench 35. The remainder of polysilicon fill material 121 becomes part of the common "bus" connection P+ rails 79 between memory cells (see FIG. 23—P+ rail bus 121' ) and provides the bias voltage to substrate 401 of the I/O device. Isolation etching is required in the N+ rail trench 37 which forms a continuous "bus" connection 83 between adjacent memory cells (see FIG. 23—P+ rail bus 121' ). isolation etching is not performed in N+ rail trench 37 so that top N+ rail fill material 125 may provide "bus" connections between the N+ rails of adjacent chips (see FIG. 23—N+ rail bus 125). Thus, appropriate isolation and bussing is established between adjacent memory cells of the IC chip.

Figure 21:
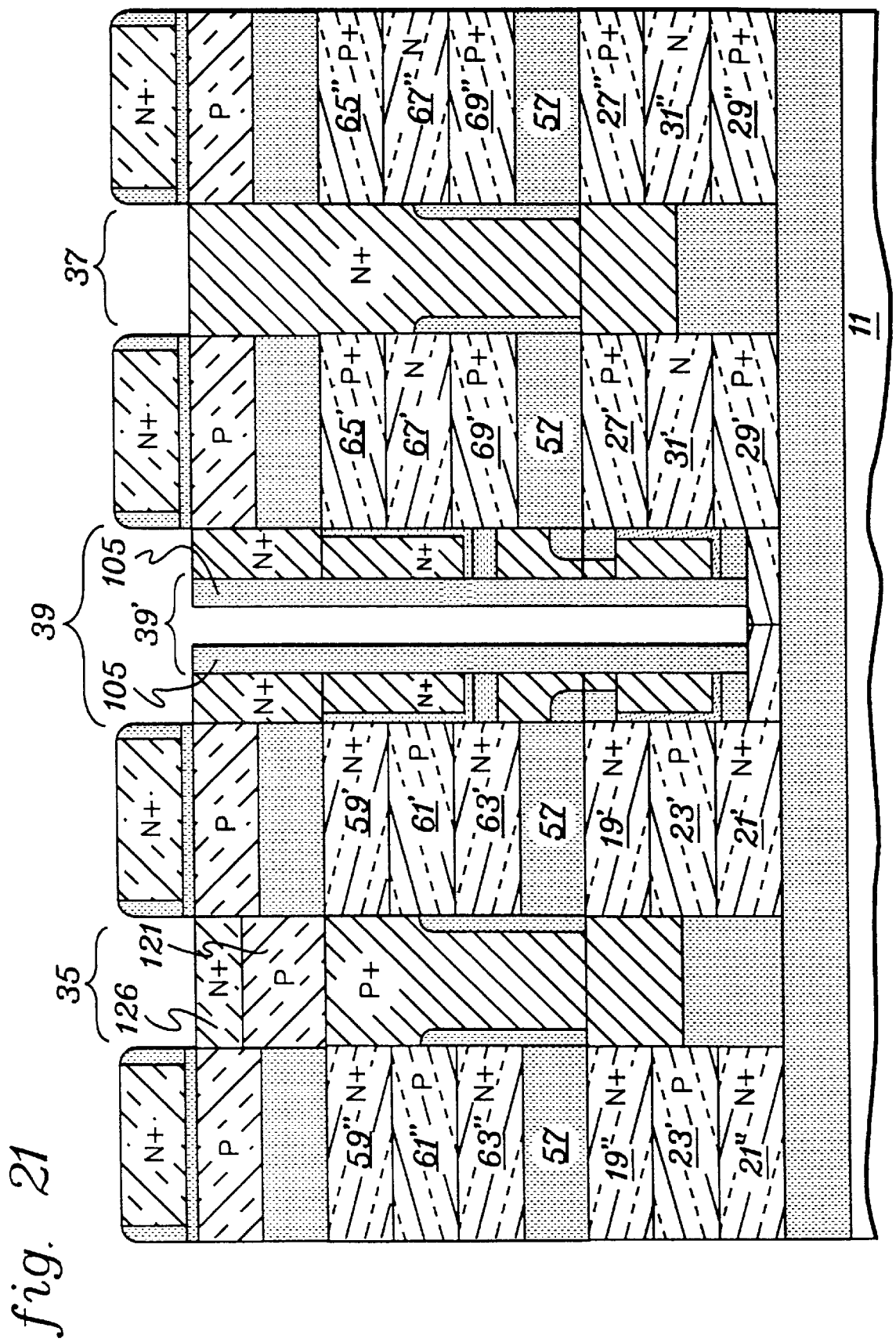
FIG. 21 is a cross-sectional view of the assembly of FIG. 20 subsequent to the etching of a channel in the active trench and deposition of an oxide layer on the sidewalls thereof in accordance with an embodiment of the present invention.
Figure 22:
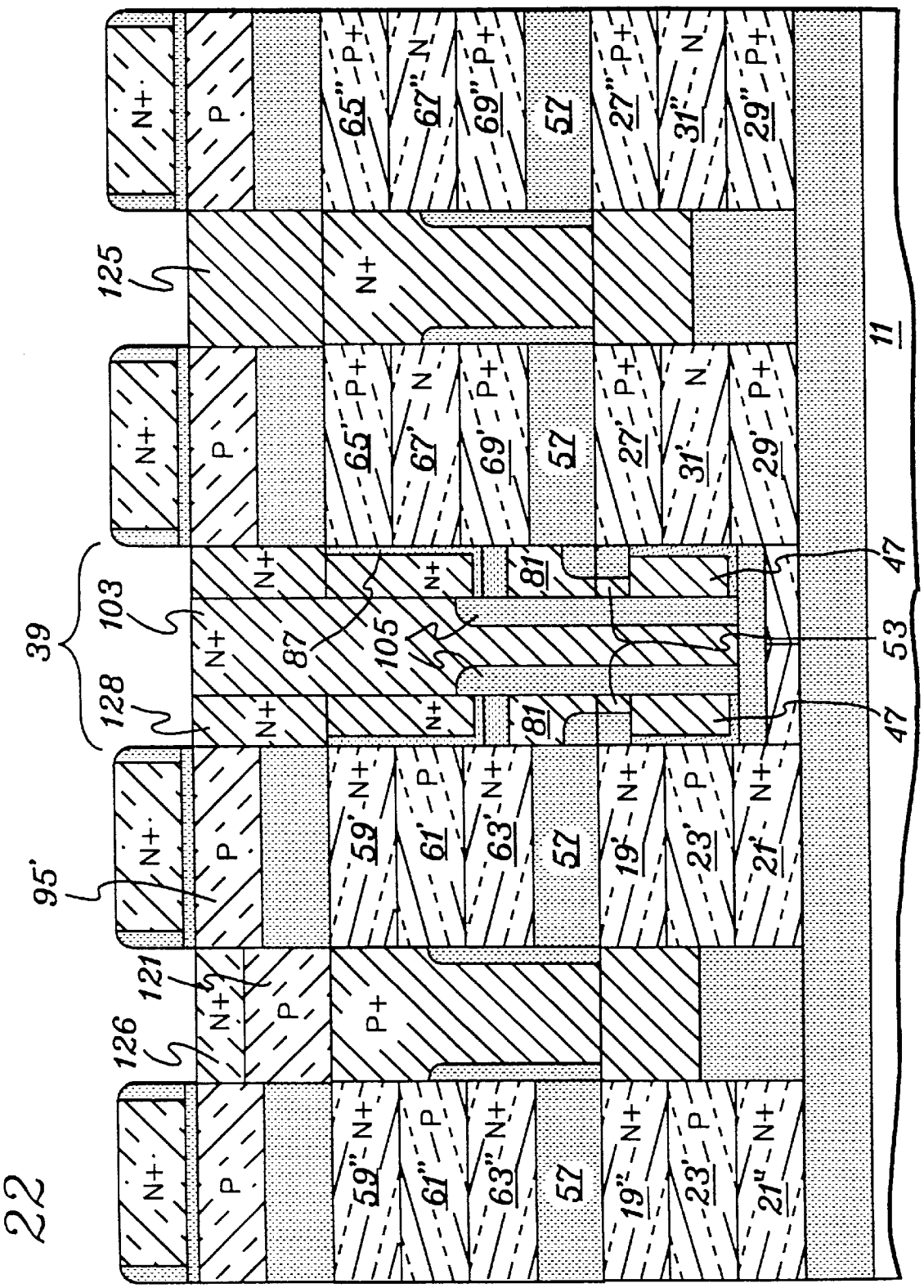
FIG. 22 is a cross-sectional view of the assembly of FIG. 21 after recessing the oxide sidewall fill within the active trench and filling the remainder of the active trench with polysilicon, completion fabrication of an SRAM cell pursuant to one embodiment of the present invention.

In a subsequent process step, a mask is used to block N+ trench 37, P+ rail trench 35 and a portion of active trench 39, leaving a hole 39' above the active trench exposed (FIG. 21). RIE is then used through the active trench polysilicon fill material and all structures within the trench, down to the bottom of the active trench, forming a channel. Oxide spacers 105 are then formed on the sidewalls of the channel within active trench 39 and recessed using the MLR techniques discussed hereinabove (FIG. 22). The channel within the active trench is filled with polysilicon 103, planarized and recessed below the level of the wordlines. Thus, coaxial wiring within the active trench is formed having a center conductor and an outer conductor. Specifically, spacer 105 separates the center and outer conductors of the coaxial wiring.

The N+ and P+ rail trenches are subsequently masked, and the top portion of the active trench is implanted (e.g., using arsenic) to create N+ doped region 128. Thus, N+ doped source region 126, N+ doped drain center conductor region 128, P-doped region 95', and N+ doped wordline (gate) 99' form the I/O transistor of the SRAM cell of the present invention. Thereafter, fabrication of the SRAM cell may be completed with the formation of bitline metal contacting N+ source region 126 as will be apparent to one of ordinary skill in the art.

Figure 23:
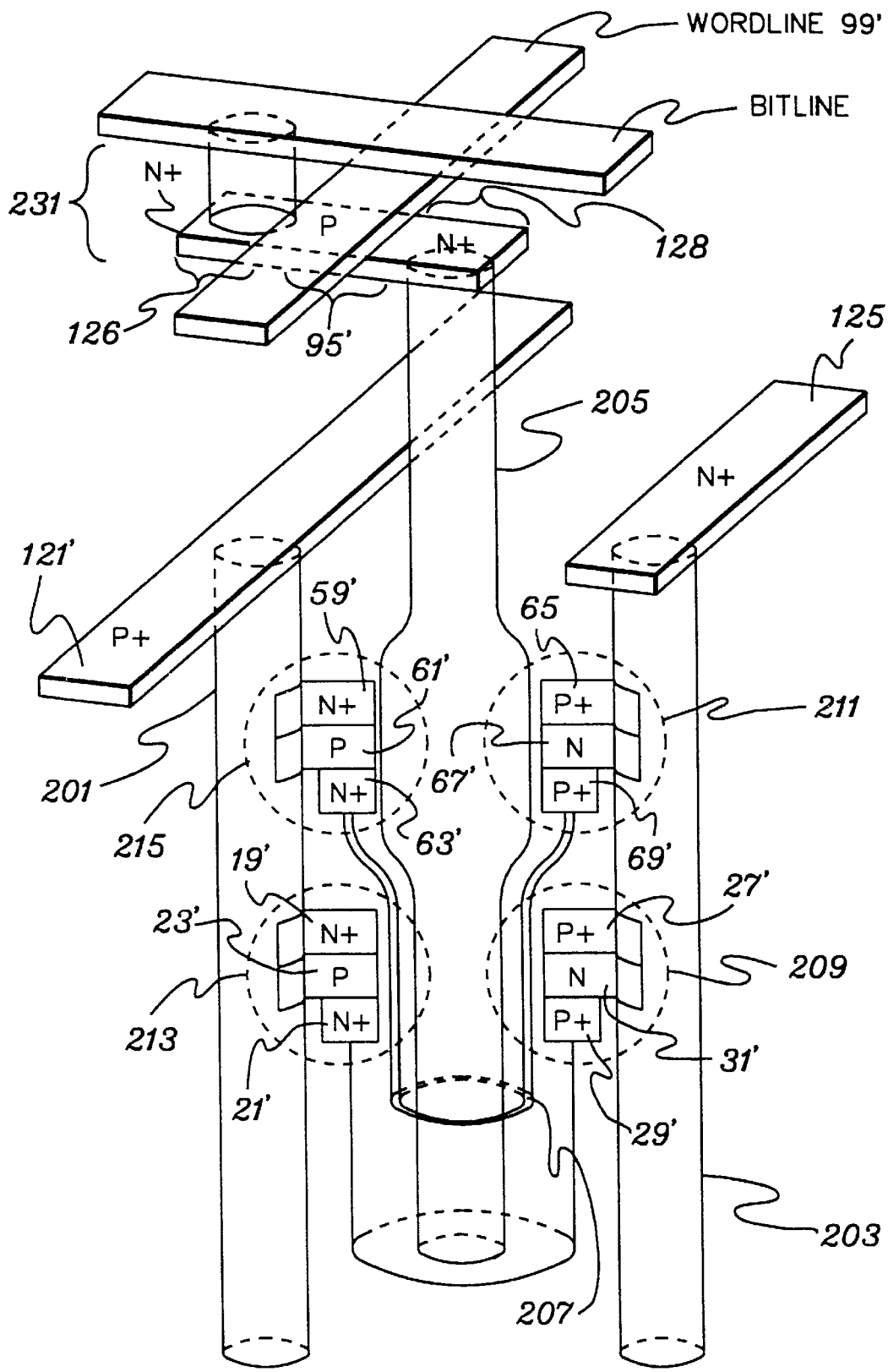
FIG. 23 is a perspective schematic view of the SRAM cell of FIG. 22 in accordance with an embodiment of the present invention.

The perspective schematic view of FIG. 23 illustrates the physical and electrical relationships between various components of the SRAM trench structure described herein. In particular, four "storage" transistors 209, 211, 213, and 215 are shown which comprise the electrically cross-coupled inverters of the memory cell. Transistors 211 and 215 comprised the first inverter, while transistors 209 and 213 comprise the second inverter. In relation to FIG. 22, within transistor 215, the doped regions are indicated. Specifically, transistor 215 has source region 591, p-doped region 61' and drain region 63'. The doped regions of the other transistors with respect to FIG. 22 are also indicated on FIG. 23.

P+ rail 201 electrically connects to the source and body regions of transistors 213 and 215. Similarly, the N+ rail electrically connects to the source and body regions of transistors 209 and 211. Coaxial wiring comprising center conductor 205 and outer conductor 207 electrically cross-couples the two inverters. Specifically, center conductor 205 is in direct contact with the drain regions of transistors 209 and 213 (i.e., the output of the second inverter). Further, center conductor 205 is minimally separated from the doped regions of transistors 211 and 215, forming their gates (i.e., the input of the first inverter).

More specifically, with respect to FIG. 22, center conductor 205 comprises the center polysilicon fill in active trench 39. This center conductor contacts drain regions 21' and 29' of transistors 213 and 209, respectively. Thin gate oxide 87 separates the center conductor from the doped regions of transistors 211 and 215 thus forming their gates. Therefore, the output from the second inverter is electrically coupled to the input of the first inverter by the center conductor of the coaxial wiring.

Outer coaxial conductor 207 is in direct contact with drain regions 63' and 69' of transistors 215 and 211 (i.e., the output of the first inverter). Specifically, with respect to FIG. 22, the outer conductor comprises polysilicon fill 81, 53 and 47. Further, outer conductor 207 is minimally separated from the doped regions of transistors 209 and 213 forming their gates (i.e., the input of the second inverter). Specifically, thin gate oxide 43 separates the outer conductor from the doped regions of transistors 209 and 213 thus forming the gates.

It should be generally noted that the electrical cross-coupling of the inverters comprising the SRAM cell results in the cross-coupling of the FETs of the SRAM cell as well. Particularly, an output (drain) of FET 209 is electrically coupled to an input (gate) of FET 211, while an output (drain) of FET 211 is electrically coupled to an input (gate) of FET 209. Thus, FETs (i.e., semiconductor devices) 209 and 211 are electrically cross-coupled. FETs 213 and 215 are electrically cross-coupled in a similar manner.

The structure of I/O transistor 231 shown in FIG. 23 may be explained in relation to FIG. 22. In particular, source region 126, body 95', drain region 128 and gate/wordline 99' are shown in FIG. 23 having the corresponding reference numbers to the associated structural elements of FIG. 22. Particularly, the bitline (FIG. 23) electrically contacts source region 126, and wordline 99' serves as the gate of the I/O transistor. Although shown separate in FIG. 23, the drain region 128 of the I/O transistor actually comprises the N+ doped top portion 128 of the center conductor of the coaxial wiring. As discussed hereinabove, the P+ rail bus comprises polysilicon 121' and the N+ rail bus comprises polysilicon 125.

Figure 24:
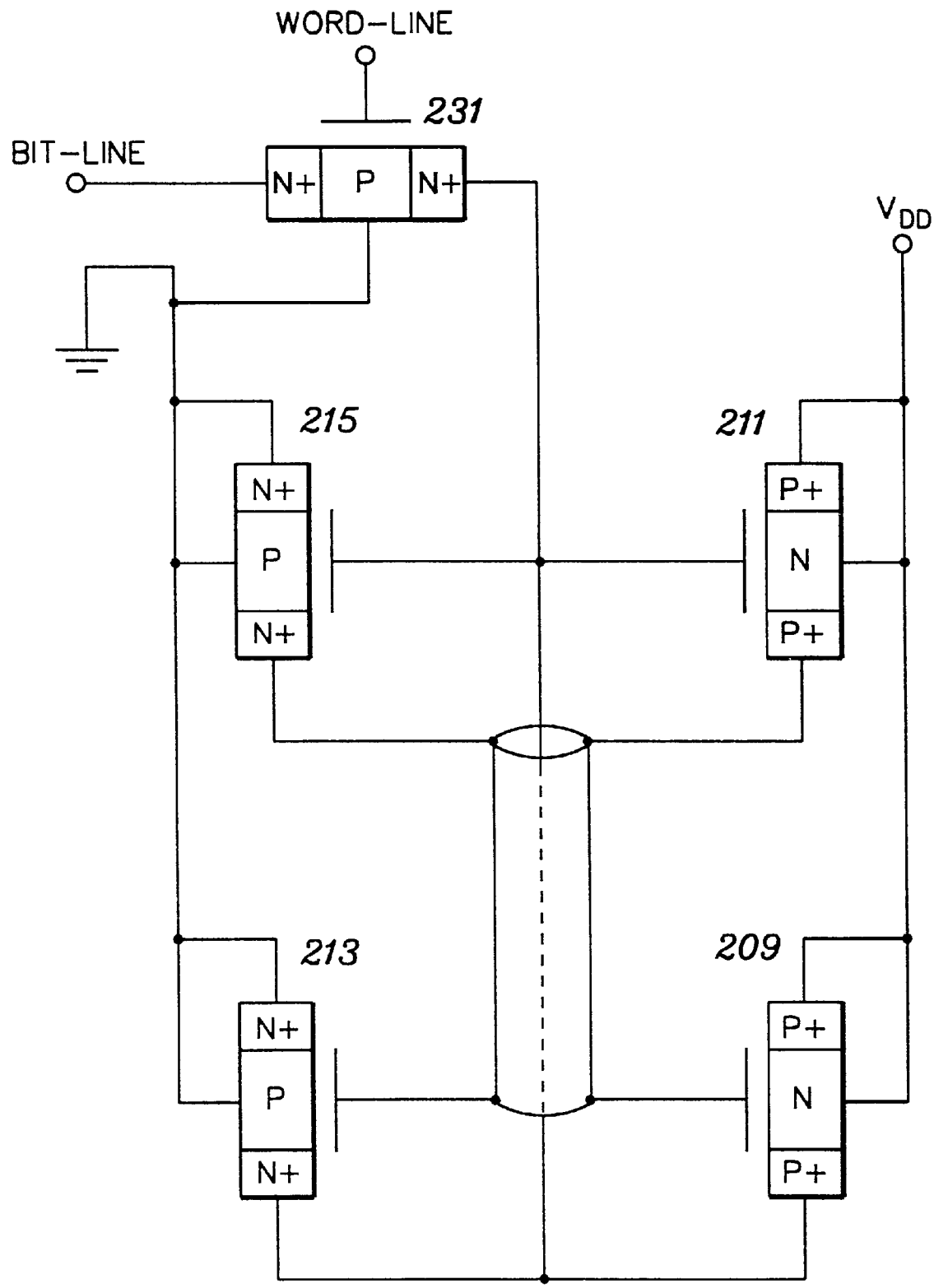
FIG. 24 is an electrical schematic view of the SRAM cell of FIG. 23, pursuant to one embodiment of the present invention.

The electrical schematic view of FIG. 24 shows the electrical interconnection of the five transistor SRAM memory cell of an embodiment of the present invention. Specifically, FETs 215 and 211 comprise the first inverter and FETs 209 and 213 comprise the second inverter. The input of the first inverter (i.e., the gates of FETs 211 and 215) is connected to the drain of I/O transistor 231. Further, the input of the first inverter is cross-coupled to the output of the second inverter (i.e., the drains of FETs 209 and 213). The input of the second inverter (i.e., the gates of FETs 209 and 213) is cross-coupled to the output of the first inverter (the drains of FETs 211 and 215).

Operationally, for example, if the input of the first inverter is low, the output of the first 1 inverter is high. Thus, the input of the second inverter is high and the output of the second inverter is low. Since the output of the second inverter (low) is fed to the input of the first inverter (low), the circuit is stable. The inverse logical relationship for a high signal at the input of the first inverter produces a similarly stable result. Thus, a flip-flop for storing data is constructed using a pair of cross-coupled inverters.

Input/output transistor 231 has two important operational functions. First, when the wordline is asserted high, the state of the flip-flop (comprising the cross-coupled inverters) is presented on the bitline. Thus, a memory read is facilitated. Second, when a logic state is to be written into the memory cell (flip-flop), the wordline is asserted high and the logic state to be written is asserted on the bitline. Transistor 231 is sized such that it may "overdrive" the output of the second inverter (i.e., overdrive the outputs of transistors 209 and 213) Thus, the first inverter will "see" the logic level presented on the bitline and not the output of the second inverter. As described hereinabove, the flip-flop "locks" onto the state of the input signal and remains stable, thus storing a "bit."

In order to eliminate parasitic FET leakage of the SRAM cell between the center coaxial conductor 103 to the N+ rail 125 in FIG. 22, extraneous wordlines 130 should be connected to the lowest potential in the circuit, i.e. ground potential. Alternatively, the extraneous wordlines 130 and associated side spacers maybe removed by etching, using a mask.

To summarize, the five transistor SRAM cell of the present invention has particular advantages and features associated therewith. For instance, by forming the complete storage flip-flop of an SRAM cell in association with a single active trench structure, significant substrate space is saved. Thus, overall memory density is increased.

Moreover, the process for forming the SRAM of the present invention facilitates very well controlled vertical channel lengths. Such control is achieved by building the doped regions and channels in the substrate prior to etching the trenches. Thus, the widths of the channels and doped regions of the FET devices of the memory cell are controlled by implantation.

Further features of the present invention include the use of coaxial wiring within the active trench to electrically cross-couple the ME s of the memory cell and the inverters composed thereof. Thus, electrical cross-coupling of devices outside of the active trench is unnecessary, further reducing the substrate area necessary for the SRAM device described herein.

Therefore, a vertically oriented, high-density, five transistor (e.g. FET) SRAM memory cell is described, along with a fabrication method therefor. Such a memory cell further contributes in density and device integration/interconnection to the semiconductor memory technology field.

While the invention has been described in detail herein, in accordance with certain preferred embodiments thereof, many modifications and changes therein may be affected by those skilled in the art. Accordingly, it is intended by the appended claims to cover all such modifications and changes as fall within the true spirit and scope of the invention.

What is claimed is:

1. A method for forming a semiconductor trench structure comprising the steps of:
   (a) providing a substrate;
   (b) forming a first transistor on said substrate, said first transistor having an input and an output;
   (c) forming a second transistor adjacent to said first transistor, said second transistor having an input and an output;
   (d) forming a trench intersecting said first transistor and said second transistor so as to expose each of said first transistor and said second transistor on at least one sidewall of said trench; and
   (e) electrically cross-coupling, within said trench, said first transistor and said second transistor, wherein said electrically cross-coupling comprises electrically connecting the input of said first transistor to the output of said second transistor and electrically connecting the input of said second transistor to the output of said first transistor.

2. The method of claim 1, wherein said step (c) of forming said second transistor comprises forming said second transistor above said first transistor for facilitating said step (e) of electrically cross-coupling said first transistor and said second transistor within said trench, wherein said trench forming step (d) comprises forming said trench such that said first transistor and said second transistor are exposed within said trench on a common sidewall.

3. The method of claim 2, wherein said step (e) of electrically cross-coupling comprises forming coaxial wiring within said trench such that said coaxial wiring electrically cross-couples said first transistor and said second transistor.

4. The method of claim 2, wherein said method further includes forming a third transistor coplanar with said first transistor, and forming a fourth transistor coplanar with said second transistor, and wherein said step (d) of forming said trench further includes forming said trench intersecting said third transistor and said fourth transistor so as to expose each of said third transistor and said fourth transistor on said at least one sidewall of said trench, and wherein said step (e) of electrically cross-coupling further includes electrically cross-coupling, within said trench, said third transistor and said fourth transistor, wherein said electrically cross-coupling comprises electrically connecting an input of said third transistor to an output of said fourth transistor and electrically connecting an input of said fourth transistor to an output of said third transistor.

5. The method of claim 4, wherein said step (e) of electrically cross-coupling comprises forming coaxial wiring within said trench such that said coaxial wiring electrically cross-couples said first transistor and said second transistor, and electrically cross-couples said third transistor and said fourth transistor.

6. The method of claim 5, wherein said step (b) of forming said first transistor and said step of forming said third transistor comprise forming a first silicon-on-insulator ("SOI") layer on said substrate, and forming said first transistor and said third transistor within a silicon layer of said first SOI layer.

7. The method of claim 6, wherein said step (c) of forming said second transistor and said step of forming said fourth transistor comprise forming a second SOI layer on said first SOI layer, and forming said second transistor and said fourth transistor within a silicon layer of said second SOI layer.

8. The method of claim 7, wherein each transistor forming step comprises forming each transistor as a field effect transistor ("FET") such that said first transistor comprises a first FET, said second transistor comprises a second FET, said third transistor comprises a third FET and said fourth transistor comprises a fourth FET.

9. The method of claim 8, wherein said step (e) of electrically cross-coupling comprises forming said coaxial wiring within said trench such that said coaxial wiring electrically cross-couples: a drain region of said first FET to a gate region of said second FET; a drain region of said second FET to a gate region of said first FET; a drain region of said third FET to a gate region of said fourth FET; and a drain region of said fourth FET to a gate region of said second FET.

10. A method of forming a semiconductor trench structure comprising the steps of:
    (a) providing a substrate;
    (b) forming a first field effect transistor (FET) on said substrate, and forming a third FET coplanar with said first FET;
    (c) forming a second FET substantially adjacent to said first FET, and forming a fourth FET coplanar to said second FET and substantially adjacent to said third FET;
    (d) forming a trench intersecting said first FET, said second FET, said third FET and said fourth FET, wherein said trench exposes each of said first FET, said second FET, said third FET and said fourth FET on at least one sidewall thereof; and
    (e) electrically cross-coupling, within said trench, said first FET and said second FET, and electrically cross-coupling within said trench said third FET and said fourth FET, wherein said electrically cross-coupling comprises forming coaxial wiring within said trench such that said coaxial wiring electrically cross-couples said first FET and said second FET, and electrically cross-couples said third FET and said fourth FET, wherein said step (e) of electrically cross-coupling comprises forming said coaxial wiring having a center conductor such that said center conductor is spaced from said second FET and from said fourth FET and also functions as gate regions thereof.

11. The method of claim 10, wherein said step (e) of electrically cross-coupling comprises forming said coaxial wiring having an outer conductor such that said outer conductor is spaced from said first FET and said third FET and also functions as gate regions thereof.

* * * * *